US 6,727,740 B2

(12) United States Patent  
Kirsch

(10) Patent No.: US 6,727,740 B2
(45) Date of Patent: Apr. 27, 2004

(54) SYNCHRONOUS MIRROR DELAY (SMD) CIRCUIT AND METHOD INCLUDING A RING OSCILLATOR FOR TIMING COARSE AND FINE DELAY INTERVALS

(75) Inventor: Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/232,475

(22) Filed: Aug. 29, 2002

(65) Prior Publication Data

US 2004/0041606 A1 Mar. 4, 2004

(51) Int. Cl.[7] .................................................. H03L 7/00
(52) U.S. Cl. ....................................... 327/161; 327/276
(58) Field of Search ................................ 327/161, 162, 327/163, 175, 276, 286, 284, 279, 261; 331/57, 17

(56) References Cited

U.S. PATENT DOCUMENTS

| | | | |
|---|---|---|---|
| 4,965,810 A | 10/1990 | Peischl et al. ................. 375/80 |
| 5,077,686 A | 12/1991 | Rubinstein ................... 395/550 |
| 5,233,316 A * | 8/1993 | Yamada et al. ............... 331/45 |
| 5,574,508 A | 11/1996 | Diamant ..................... 348/511 |
| 5,675,273 A | 10/1997 | Masleid ....................... 327/156 |
| 5,757,218 A * | 5/1998 | Blum ........................... 327/175 |
| 5,910,740 A | 6/1999 | Underwood ................. 327/149 |
| 5,946,244 A | 8/1999 | Manning ..................... 365/194 |
| 5,955,905 A | 9/1999 | Idei et al. ..................... 327/160 |
| 6,069,508 A | 5/2000 | Takai ........................... 327/161 |
| 6,087,868 A | 7/2000 | Millar ......................... 327/156 |
| 6,107,891 A | 8/2000 | Coy ............................. 331/18 |
| 6,194,932 B1 | 2/2001 | Takemae et al. ............. 327/158 |
| 6,239,641 B1 | 5/2001 | Lee ............................. 327/270 |
| 6,240,042 B1 | 5/2001 | Li ............................... 365/233 |
| 6,304,117 B1 | 10/2001 | Yamazaki et al. ........... 327/158 |
| 6,310,822 B1 | 10/2001 | Shen ........................... 365/233 |
| 6,330,197 B1 * | 12/2001 | Currin et al. ................ 365/194 |
| 6,373,307 B1 | 4/2002 | Takai ........................... 327/161 |
| 6,378,079 B1 | 4/2002 | Mullarkey ................... 713/401 |
| 6,404,248 B1 | 6/2002 | Yoneda ....................... 327/158 |
| 6,426,900 B1 | 7/2002 | Maruyama et al. ......... 365/194 |
| 6,480,047 B2 * | 11/2002 | Abdel-Maguid et al. ... 327/161 |
| 6,484,268 B2 | 11/2002 | Tamura et al. .............. 713/600 |
| 6,556,489 B2 | 4/2003 | Gomm et al. ............... 365/194 |
| 2002/0167346 A1 | 11/2002 | Yoon et al. .................. 327/158 |
| 2002/0176315 A1 | 11/2002 | Graaff ......................... 365/233 |
| 2002/0180499 A1 | 12/2002 | Kim et al. ................... 327/158 |

OTHER PUBLICATIONS

Chae, Jeong–Seok et al., "Wide Range Single–Way–Pumping Synchronous Mirror Delay", IEEE Electronics Letter Online No. 20000711, Feb. 11, 2000, pp. 939–940.

(List continued on next page.)

Primary Examiner—Linh M. Nguyen
(74) Attorney, Agent, or Firm—Dorsey & Whitney LLP

(57) ABSTRACT

A synchronous mirror delay includes a ring oscillator that generates a plurality of tap clock signals with one tap clock signal being designated an oscillator clock signal. In response to an input clock signal, a model delay line generates a model delayed clock signal having a model delay relative to the input clock signal. A coarse delay circuit generates a coarse delay count responsive to the oscillator, input, and model delayed clock signals, and activates a coarse delay enable signal responsive to the delay count being equal to a reference count value. A fine delay circuit latches the tap clock signals and develops a fine delay from the latched signals, and activates a fine delay enable signal having the fine delay in response to the coarse delay enable signal. An output circuit generates a delayed clock signal responsive to the coarse and fine delay enable signals going active.

40 Claims, 9 Drawing Sheets

OTHER PUBLICATIONS

Jang, Seong–Jin et al., A Compact Ring Delay Line for High Speed Synchronous DRAM, IEEE Symposium on VLSI Circuits Digest of Technical Papers, 1998, pp. 60–61.

Kuge, Shigehiro et al., "A 0.18 μm 256Mb DDR–SDRAM with Low–Cost Post–Mold–Tuning Method for DLL Replica", IEEE International Solid–State Circuits Conference, Feb. 2000, pp. 402–403.

Saeki, Takanori et al., "A 2.5ns Clock Access 250MHz 256Mb SDRAM with a Sychronous Mirror Delay", IEEE International Solid–State Circuits Conference, Feb. 1996, pp. 374–375.

Takai, Yasuhiro et al., A 250Mb/s/pin 1Gb Double Data Rate SDRAM with a Bi–Directional Delay and an Inter–Bank Shared Redundancy Scheme, 1999.

* cited by examiner

SYNCHRONOUS MIRROR DELAY (SMD) CIRCUIT AND METHOD INCLUDING A RING OSCILLATOR FOR TIMING COARSE AND FINE DELAY INTERVALS

TECHNICAL FIELD

The present invention relates generally to integrated circuits, and more specifically to synchronizing internal clocking signals generated in an integrated circuit with external clocking signals applied to the integrated circuit.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modem synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

To synchronize external and internal clock signals in modern synchronous memory devices, a number of different approaches have been considered and utilized, including delay-locked loops (DLLs), phased-locked loops (PLLs), measure controlled delays (MCDs), and synchronous mirror delays (SMDs), as will be appreciated by those skilled in the art. As used herein, the term synchronized includes signals that are nominally coincident and signals that have a desired delay relative to one another. FIG. 1 is a functional block diagram of a conventional SMD 100 that receives an applied clock signal CLK and generates a synchronized clock signal CLKSYNC in response to the CLK signal, the CLKSYNC being synchronized with the CLK signal. The SMD 100 includes an input buffer 102 that receives the CLK and generates a buffered clock signal CLKBUF in response to the CLK signal. The CLKBUF signal has a delay D1 relative to the CLK signal, where D1 corresponds to the inherent propagation delay of the input buffer.

A model delay line 104 receives the CLKBUF signal and generates a forward delay clock signal FDCLK having a model delay D1+D2 relative to the CLKBUF signal. The model delays D1 and D2 simulate the delay D1 introduced by the input buffer 102 and a delay D2 introduced by an output buffer 106 that generates the CLKSYNC signal, as will be explained in more detail below. The FDCLK signal propagates through a forward delay line 108 including a plurality of unit delays 110A-N coupled in series, each unit delay receiving an input signal from the prior unit delay and generating an output signal having a unit delay UD relative to the input signal. Each unit delay 110A-N may, for example, be an AND gate having one input enabled as indicated for the unit delay 110A, with the inverter introducing the unit delay UD corresponding to the propagation delay of the inverter. In the forward delay line 104, the FDCLK signal propagates through the unit delays 110A-N from left to right in FIG. 1, as indicated by the orientation of the inverter in the unit delay 110A. The forward delay line 108 includes a plurality of outputs 112A-N, each output 112A-N being coupled to the output from the corresponding unit delay 110A-N, respectively. As the FDCLK signal propagates through the unit delays 110A-N, when the signal is present on a respective output 112A-N the signal is designated a delayed forward clock signal DFDCLK.

A backward delay line 114 includes a plurality of unit delays 116A-N coupled in series as previously described for the forward delay line 108. Instead of providing the outputs from the unit delays 116A-N as with the forward delay line 108, however, the backward delay line 114 has a plurality of inputs. 118A-N, each input being coupled to the input of the corresponding unit delay 116A-N, respectively. Once again, each unit delay 116A-N may be formed by an AND gate having one input coupled to the corresponding input 118A-N. A mirror controller 120 is coupled to the outputs 112A-N of the forward delay line 108 and the inputs 118A-N of the backward delay line 114. In response to rising-edges of the CLKBUF signal, the mirror controller 120 applies the DFDCLK signal from the corresponding unit delay 110A-N in the forward delay line 108 to the input of the corresponding unit delay 116A-N in the backward delay line 114. For example, if the FDCLK signal has propagated to the output of the unit delay 110J, the mirror controller 120 outputs the DFDCLK signal on the output of the unit delay 110J to the input of the unit delay 116J in the backward delay line 114. The unit delays 116A to 116I and 116K to 116N are unaffected. The DFDCLK signal propagates through the corresponding unit delay 116J in the backward delay line 114 and through all unit delays 116I-A to the left of that unit delay, and is output from the backward delay line 114 as a delayed clock signal CLKDEL. Thus, in the backward delay line 114, DFDCLK signal propagates through the unit delays 116A-N from right to left in FIG. 1, as indicated by the orientation of the AND gate in the unit delay 116A. The output buffer 106 receives the CLKDEL signal and generates the CLKSYNC in response to the CLKDEL signal, with the CLKSYNC being delayed by the delay D2 introduced by the output buffer.

The overall operation of the SMD 100 in synchronizing the CLKSYNC signal with the CLK signal will now be described in more detail with reference to FIG. 1 and a signal timing diagram of FIG. 2 illustrating various signals generated by the SMD during operation. In the example of FIG. 2, an initial rising-edge of the CLK signal occurs at a time T0. In response to the rising-edge of the CLK signal at the time T0, the input buffer 102 drives the CLKBUF signal high the delay D1 later at a time T1, with this initial rising-edge of the CLKBUF signal being designated the N edge of the CLKBUF signal. In response to the rising-edge transition of the CLKBUF signal at the time T1, the mode delay line 104 drives the FDCLK signal high the model delay D1+D2 later at a time T2. The FDCLK signal thereafter propagates through the unit delays 110A-N in the forward delay line 108 until a next rising-edge N+1 of the CLKBUF signal is applied to the mirror controller 120 at a time T3. At the time T3, the forward delay line 108 has delayed the FDCLK signal by a forward delay FD that equals TCK-(D1+D2) where TCK is the period of the CLK signal. This is true because, as illustrated in FIG. 2, the next rising-edge of the CLKBUF signal occurs TCK-(D1+D2) after the initial rising-edge of the FDCLK signal at the time T2.

In response to the rising-edge of the CLKBUF signal at the time T3, the mirror controller 120 applies the FDCLK signal from the output of the appropriate unit delay 110A-N in the forward delay line 108 to the corresponding input 118A-N of the backward delay line 114. For example, assume that the delay TCK-(D1+D2) equals eleven unit delays UD so that the mirror controller 120 receives the DFDCLK signal from the output 112K of the unit delay 110K in the forward delay line 108. In this situation, the mirror controller 120 applies the DFDCLK signal to the input 118K of the unit delay 116K in the backward delay line 114. This is illustrated in FIG. 2 as a rising-edge of the DFDCLK signal at the time T3.

The DFDCLK signal thereafter propagates through the appropriate unit delays 116J-A in the backward delay line 114, and at a time T4 the backward delay line 114 drives the CLKDEL signal high in response to the applied DFDCLK signal. At the time T4, the backward delay line 114 has delayed the DFDCLK signal by a backward delay BD that equals TCK-(D1+D2) which equals the forward delay FD of the forward delay line 108. This is true because the DFDCLK signal propagates through the same number of unit delays 116A-N in the backward delay line 114 as did the FDCLK signal to the unit delays 110A-N in the forward delay line 108, as will be appreciated by those skilled in the art. The total delay of the CLKDEL signal at the time T4 equals D1+D1+D2+TCK-(D1+D2)+TCK-(D1+D2), which equals 2TCK-D2. Thus, the rising-edge of the CLKDEL signal at the time T4 occurs the delay D2 of the output buffer 106 before a next rising-edge of the CLK signal at a time T5. In response to the CLKDEL signal at the time T4, the output buffer 106 drives the CLKSYNC signal high at the time T5 and in synchronism with the rising-edge of the CLK signal. In this way, the SMD 100 generates the CLKSYNC signal having rising-edges that are synchronized with the rising-edges of the CLK signal.

In the SMD 100, although the input buffer 102 and output buffer 106 are illustrated as single components, each represents all components and the associated delays between the input and output of the SMD 100. The input buffer 106 thus represents the delay D1 of all components between an input that receives the CLK signal and the input to the model delay line 104, and the output buffer 106 represents the delay D2 of all components between the output of the backward delay line 114 and an output at which the CLKSYNC signal is developed, as will be appreciated by those skilled in the art.

In SMD 100, the forward and backward delay lines 108, 114 each include the same number of unit delays 110A-N, 116A-N. A large number of unit delays 110A-N, 116A-N is desirable to provide the SMD 100 with better resolution in generating the forward and backward delays FD, BD, which hereinafter will collectively be referred to as a variable delay VD (i.e., VD=FD+BD). The resolution of the SMD 100 is the smallest increment of delay that may be added and subtracted from the variable delay VD, which equals twice the unit delay UD of the unit delays 110A-N, 116A-N in the SMD 100. Better resolution means the CLK and CLKSYNC signals will be properly synchronized, as will be appreciated by those skilled in the art. In addition, the forward and backward delay lines 108, 114 must be able to collectively provide a maximum variable delay VD corresponding to the CLK signal having the lowest frequency in the frequency range over which the SMD 100 is designed to operate. This is true because the forward and backward delay lines 108, 114 must each provide a delay of NxTCK-(D1+D2), which will have its largest value when the period TCK of the CLK signal is greatest, which occurs at the lowest frequency of the CLK signal.

Taken together, the desired resolution and maximum variable delay VD of the SMD 100 can result in the delay lines 108, 114 consisting of a large number of individual delay stages 110A-N, 116A-N that consume a relatively large amount of space on a semiconductor substrate in which the SMD 100 and other components of the synchronous memory device are formed. Moreover, such a large number of individual delay stages 11A-N, 116A-N can result in significant power consumption by the SMD 100, which may be undesirable, particularly in applications where the synchronous memory device is contained in a portable battery-powered device.

There is a need for an SMD having good resolution that occupies less space on a semiconductor substrate and consumes less power.

SUMMARY OF THE INVENTION

According to one aspect of the present invention, a synchronous mirror delay includes a ring oscillator that generates a plurality of tap clock signals with one tap clock signal being designated an oscillator clock signal. Each tap clock signal has a respective delay relative to the oscillator clock signal. A model delay line receives an input clock signal and generates a model delayed clock signal in response to the input clock signal. The model delayed clock signal has a model delay relative to the input clock signal. A coarse delay circuit generates a coarse delay count responsive to the oscillator, input, and model delayed clock signals, and also activates a coarse delay enable signal responsive to the delay count being equal to a reference count value. A fine delay circuit latches the tap clock signals responsive to the input clock signal and develops a fine delay from the latched tap clock signals. The fine delay circuit activates a fine delay enable signal in response to the coarse delay enable signal, the fine delay enable signal having the fine delay relative to the coarse delay enable signal. An output circuit is coupled to the coarse and fine delay circuits and generates a delayed clock signal responsive to the coarse and fine delay enable signals going active.

DETAILED DESCRIPTION OF THE INVENTION

Figure 1:
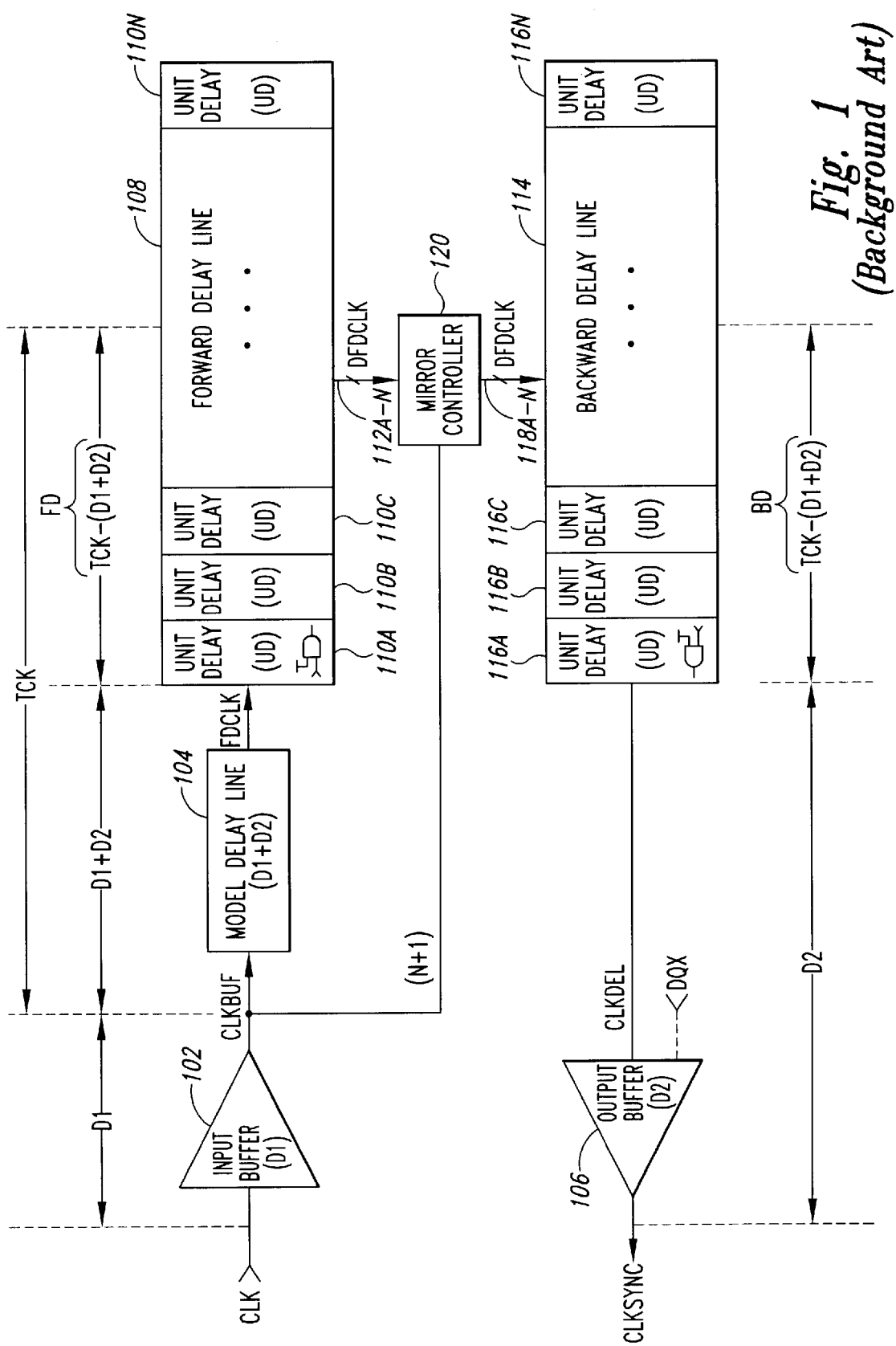
FIG. 1 is a functional block diagram of a conventional SMD.
Figure 2:
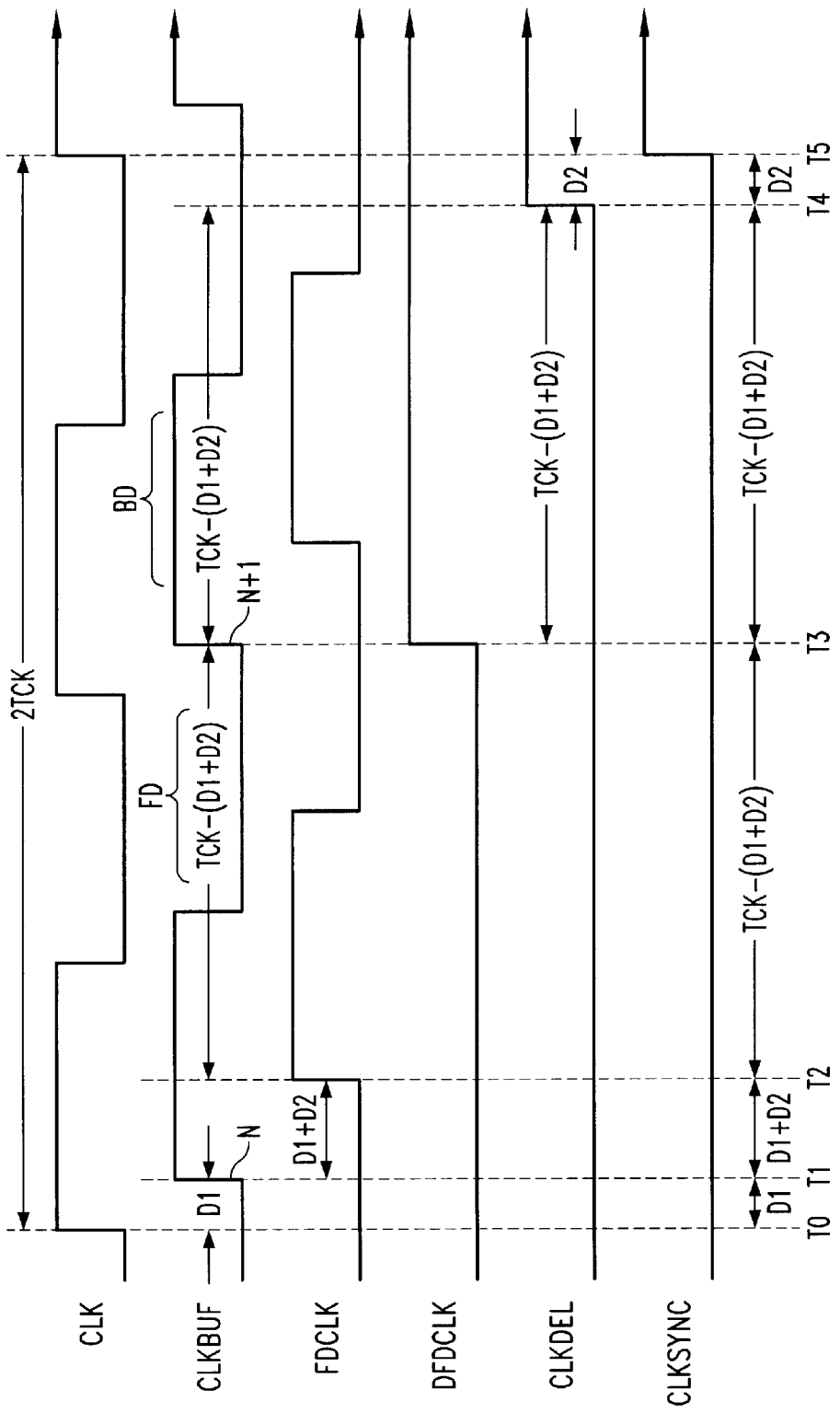
FIG. 2 is a signal timing diagram showing various signals generated by the SMD of FIG. 1 during operation.
Figure 3:
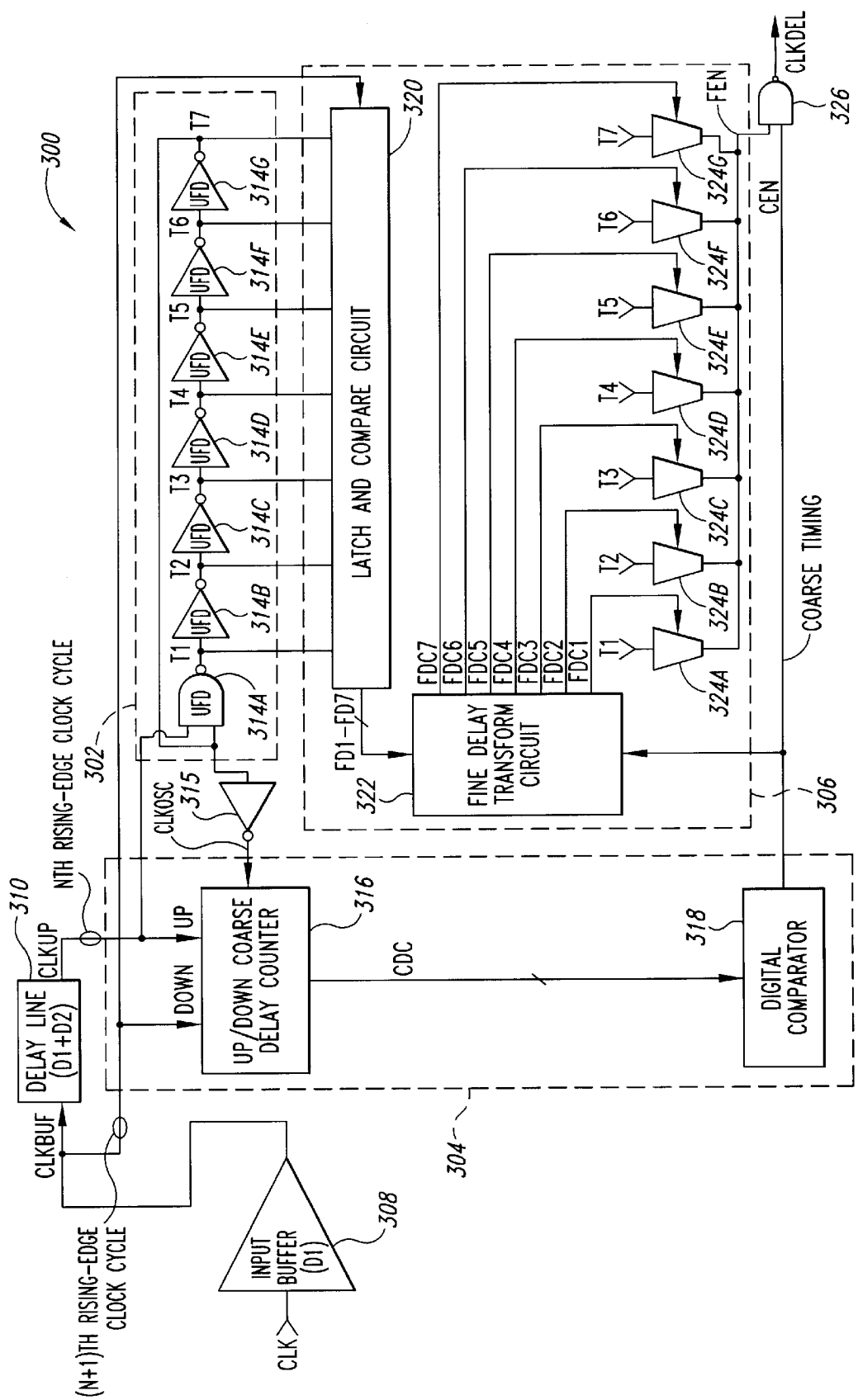
FIG. 3 is a functional block diagram illustrating a rising-edge SMD including a ring oscillator for generating coarse and fine delays of a delayed clock signal.

FIG. 3 is a functional block diagram of a rising-edge portion of an SMD 300 that eliminates the relatively large and high power forward and backward delay lines 108, 114 contained in the conventional SMD 100 of FIG. 1, and instead includes a ring oscillator 302 that clocks coarse counter circuitry 304 to define a coarse delay CD and is utilized by fine delay circuitry 306 to define a fine delay FD. In operation, the SMD 300 adjusts the values of the coarse and fine delays CD, FD to generate a delayed clock signal CLKDEL that is synchronized with (i.e., has a desired delay relative to) an external clock signal CLK, as will be described in more detail below. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

In the SMD 300, an input buffer 308 receives the CLK signal and develops a clock buffer signal CLKBUF in response to the CLK signal. The input buffer 308 introduces an input buffer delay D1, causing the CLKBUF signal to be delayed by the input buffer delay D1 relative to the CLK signal. A model delay line 310 receives the CLKBUF signal and generates an up-count delayed clock signal CLKUP having a model delay D1+D2 relative to the CLKBUF signal. The model delays D1 and D2 simulate the delay D1 introduced by the input buffer 308 and a delay D2 introduced by an output buffer (not shown).

The ring oscillator 302 includes a NAND gate 314A and a plurality of inverters 314B-G connected in series, with the outputs from the NAND gate 314A and inverters 314A-G generating tap clock signals T1–T7, respectively. The NAND gate 314A includes a second input that receives the CLKUP signal. Each tap clock signal T1–T7 has a unit fine delay UFD relative to the preceding tap clock signal, and also has a corresponding delay relative to the tap clock signal T7. The tap clock signal T7 from the final inverter 314G is applied through an inverter 315 to generate an oscillator clock signal CLKOSC. The unit fine delay UFD corresponds to the respective propagation delays of the AND gate 314A and the inverters 314B-G. Once skilled in the art will understand suitable circuitry for forming the NAND gate 314A having approximately the same unit fine delay UFD as the inverters 314B-G. Thus, the tap clock signal T1 is inverted and has a delay UFD relative to the tap clock signal T7, as does the tap clock signal T2 relative to the tap clock signal T1, and so on for the remaining tap clock signals T3–T6. The fine delay circuitry 306 utilizes the tap clock signals T1–T7 in defining the fine delay FD of the CLKDEL signal, as will be described in more detail below. The ring oscillator 302 may include more or fewer inverters 324, as will be appreciated by those skilled in the art.

The coarse delay circuitry 304 includes an up/down coarse delay counter 316 that is clocked by the CLKOSC signal and develops a coarse delay count CDC in response to the CLKOSC signal. The counter 316 receives the CLKUP signal on an up count input, and operates in an up-count mode in response to rising edge of the CLKUP signal to increment the CDC count in response to each rising edge of the CLKOSC signal. The counter 316 operates in the up-count mode until a rising edge of the CLKBUF signal is received on a down-count input. In response to the rising edge of the CLKBUF signal, the counter 316 operates in a down-count mode to decrement the CDC count in response to each rising edge of the CLKOSC signal. In operation, the counter 316 operates in the up-count mode in response to a rising-edge of the CLKUP signal to increment the CDC count from an initial value responsive to each rising-edge of the CLKOSC signal. When the counter 316 receives a rising-edge of the CLKBUF signal, operation in the down-count mode commences and the counter decrements the CDC count responsive to each rising edge of the CLKOSC signal to decrement the CDC count from the final value reached in the up-count mode to the initial value. Each increment or decrement of the CDC count corresponds to a period TCK of the CLKOSC signal since the CDC count is incremented or decremented in response to each rising edge of the CLKOSC signal. If a unit coarse delay UCD is defined as being equal to the period TCK of the CLKOSC signal, then each unit coarse delay equals fourteen unit fine delays UFD (UCD=14×UFD) since the CLKOSC signal propagates through the NAND gate 314A and each inverter 314B-G twice during each cycle of the CLKOSC signal. A digital comparator 318 receives the CDC count, and generates an active coarse enable signal CEN when the CDC count is equal to the initial value.

The fine delay circuitry 306 includes a latch and compare circuit 320 that latches the tap clock signals T1–T7 from the ring oscillator 302 in response to a rising edge of the CLKBUF signal. In this way, the latch and compare circuit 320 captures the state of the ring oscillator 302 at a given point in time (i.e., at the rising edge of the CLKBUF signal). The latch and compare circuit 320 thereafter generates a plurality of fine delay signals FD1–FD7 from the latched tap clock signals T1–T7. More specifically, the latch and compare circuit 320 performs an XOR operation on each pair of adjacent tap clock signals T1–T7, with the result of each XOR operation generating the corresponding FD1–FD7 signal. For example, the latch and compare circuit 320 performs an XOR of the tap clock signals T1 and T2 to generate the FD1 signal, performs an XOR of the tap clock signals T2 and T3 to generate the FD2 signal, and so on, with the XOR of the tap clock signals T7 and T1 generating the FD7 signal.

In operation, the latch and compare circuit 320 will activate the FD1–FD7 signal that corresponds to the location of the rising or falling edge of the CLKOSC at the point in time that a rising edge of the CLKBUF signal occurs. In this way, the latch and compare circuit 320 latches the location of the rising or falling edge of the clock signal that is propagating through the NAND gate 314A and inverters 314B-G when a rising edge of the CLKBUF signal occurs. This is true because during operation of the ring oscillator 302, rising and falling edges of the tap clock signal T1 propagate through the NAND gate 314A and inverters 314A-G to thereby sequentially generate corresponding rising and falling edges of the tap clock signals T2–T7. At any given point in time, one of the NAND gate 314A and inverters 314B-G will be developing the rising or falling edge of the tap clock signal T7. The XOR of the pair of tap clock signals T1–T7 associated with this particular NAND gate 314A or inverter 314B-G will equal "0,", while the XORs of all other tap clock signal pairs will equal "1." This is understood by noting that any inverter 314BA-G or the NAND gate 314A that is not developing the rising or falling edge of the tap clock signal T7 will have either a high input and low output or vice versa, and thus the XOR of the associated tap clock signals T1–T7 will equal 1. In contrast, the NAND gate 314A or inverter 314B-G that is developing the edge of the tap clock signal T7 will have an input tap clock signal T1–T7 having the same logic level as the output tap clock signal, and thus the XOR of these tap clock signals will equal 0. The logic levels of the input and output tap clock signals T1–T7 of the NAND gate 314A or inverter 314B-G that is developing the edge of the tap clock signal T7 are the same due to the propagation delays of the NAND gate and inverters, as will be appreciated by those skilled in the art. For example, if the NAND gate 314A is developing the rising edge of the tap clock signal T1, the inverter 314G will first generate the rising edge of the tap clock signal T7 and this rising edge is applied to the NAND gate 314A. Prior to the rising edge of the tap clock signal T7 being applied to the NAND gate 314A, the NAND gate drives the T1 signal high. Thus, when the rising edge of the tap clock signal T7 is initially applied to the input of the NAND gate 314A, the NAND gate has a high input (tap clock signal T7) and a high output (T1 signal). If this is the point at which the T7 and T1 signals are latched, the XOR of these signals will equal 0, which corresponds to the FD1 signal.

A fine delay transform circuit 322 receives the FD1–7 signals from the latch and compare circuit 320 and processes these signals to select one of a plurality of fine delay control signals FDC1–7, as will be explained in more detail below. In response to a rising edge of the CEN signal, the transform circuit 322 activates the selected one of the FDC1–7 signals. A plurality of transmission gates 324A-G receive the FDC1–7 signals, respectively, and also receive the tap clock signal T1–T7 on respective first signal terminals. A second signal terminal of each transmission gate 324A-G is coupled to a first input of an AND gate 326. In response to the FDC1–7 signals, a selected one of the transmission gates 324A-G turns ON and outputs the corresponding tap clock signal T1–T7 as a fine enable signal FEN on the second signal terminal. For example, when the FDC3 signal is activated, the transmission gate 324C turns ON and outputs the T3 signal as the FEN signal. The AND gate 336 also receives the CEN signal from the comparator 318 on a second input and develops the delayed clock signal CLKDEL in response to the CEN and FEN signals. The CLKDEL signal has a desired delay relative to particular rising edges of the CLK signal, as will be described in more detail below.

Figure 4:
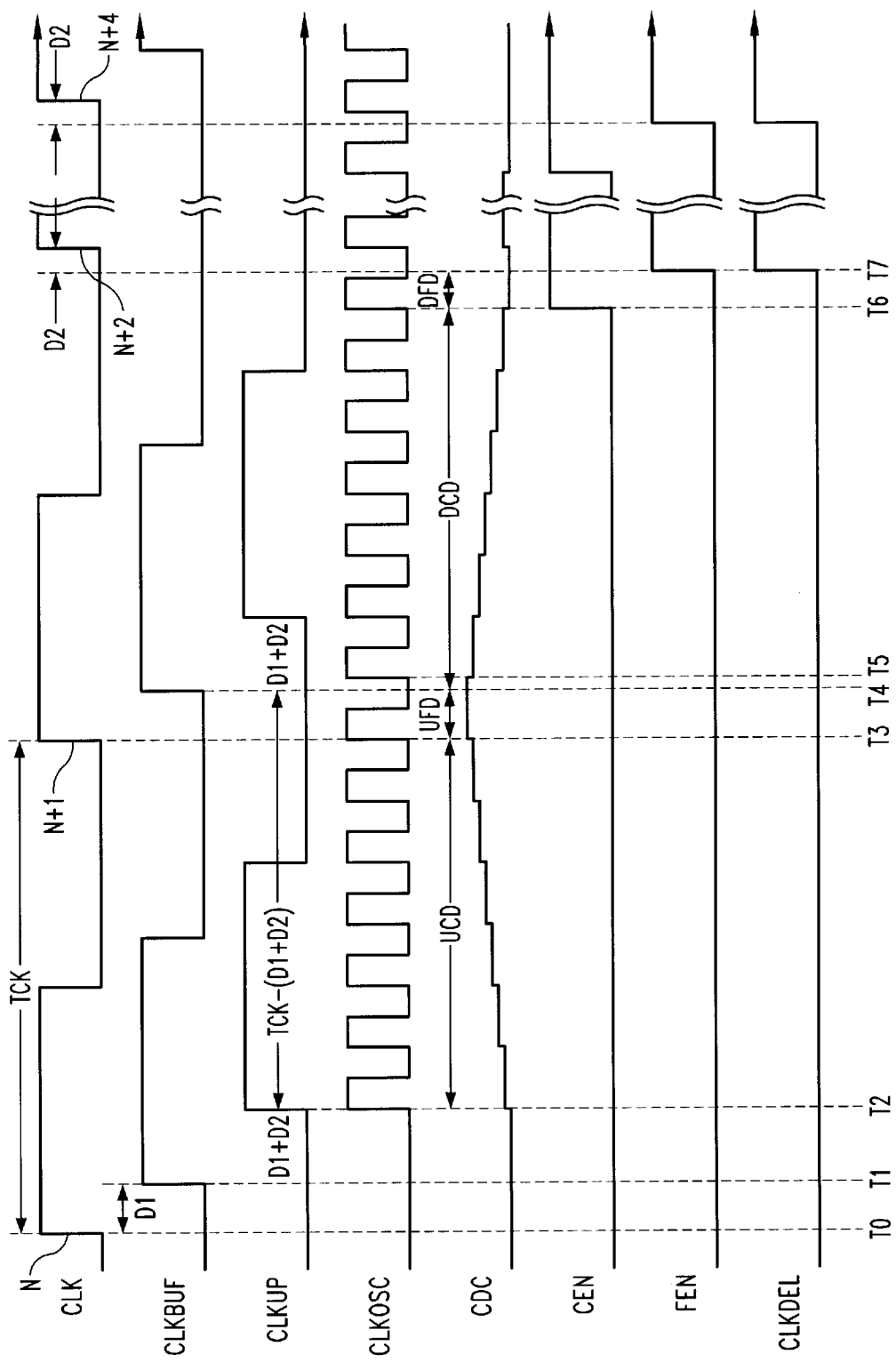
FIG. 4 is a signal timing diagram illustrating various signals generated by the SMD of FIG. 3 during operation.

The overall operation of the SMD 300 will now be described in more detail with reference to the block diagram of FIG. 3 and a signal timing diagram of FIG. 4 that illustrates various signals generated by the SMD during operation. In the example of FIG. 4, the up/down coarse delay counter 316 initially sets the CDC count to a value of zero, and the transmission gates 324A-G are initially assumed to all be turned OFF and the FEN signal to be low so that the AND gate 326 drives the CLKDEL low. At a time T0, an initial rising edge N of the CLK signal occurs and the input buffer 308 drives the CLKBUF signal high the delay D1 later at a time T1 in response to the rising edge of the CLK signal. In response to the rising edge of the CLKBUF signal, the model delay line 310 drives the CLKUP signal high the model delay D1+D2 later at a time T2. Note that the rising edge of the CLKBUF signal is also applied to the latch and compare circuit 320, but that at this point the operation of latch and compare circuit in response to this signal does not affect operation of the SMD 300 and is thus ignored in this description.

In response to the CLKUP signal at the time T2, the ring oscillator 302 is activated (i.e., the NAND gate 314A is enabled and the corresponding edge of a clock signal begins propagating through the NAND gate and inverters 314B-G). The delay counter 316 also begins operating in the up-count mode responsive to the CLKUP signal, and increments the CDC count in response to each rising edge of the CLKOSC signal from the ring oscillator 302. The counter 316 increments the CDC count in response to each rising edge of the CLKOSC signal until a time T3, which corresponds to the last rising edge of the CLKOSC signal that occurs before the next rising edge of the CLKBUF signal is applied to the counter 316 at a time T4. The rising edge of the CLKBUF signal at the time T4 occurs in response to the next rising edge N+1 of the CLK signal. In response to the rising edge of the CLKBUF signal at the time T4, the counter 316 commences operation in the down-count mode and begins decrementing the CDC count at the time T5 in response to the next rising edge of the CLKOSC signal. Also in response to the rising edge of the CLKBUF signal at time T4, the latch and compare circuit 320 latches the state of the tap clock signals T1–T7 at this point in time. As indicated in FIG. 4, the period from the time T2 until the time T3 is designated an up count coarse delay UCD, and the period from the time T3 to the time T4 is designated an up count fine delay UFD, with the sum of the delays UCD+UFD equaling a delay TCK-(D1+D2), where TCK is the period of the CLK signal. The latch and compare circuit 320 generates the FD1–FD7 signals indicating the location of the current edge of the CLKOSC signal in the ring oscillator 302 at the time t4, and the fine delay transform circuit 322 thereafter activates one of the FDC1–FD7 signals in response to the FD1–FD7 signals. The activated FDC1–7 signal activates the corresponding transmission gate 324A-G to thereby output the corresponding tap clock signal T1–T7 as the FEN signal, as previously described.

From the time T4 to a time T6 the delay counter 316 continues operating in the down-count mode and decrements the CDC count in response to each rising edge of the CLKOSC signal. At the time T6, the digital comparator 318 determines the CDC count is equal to the initial value and activates the CEN signal to thereby enable the NAND gate 326. At a time T7, the activated transmission gate 324A–G outputs the selected tap clock signal T1–T7 as the FEN signal to the NAND gate 326. The period from the time T4 until the time T6 is designated a down-count coarse delay DCD, and the period from the time T6 to the time T7 is designated a down-count fine delay DFD, with the sum of the delays DCD+DFD equaling the delays UCD+UFD and thus equaling TCK-(D1+D2). At the time T7, the AND gate 326 receives the high FEN and CEN signals and accordingly drives the CLKDEL signal high, with the CLKDEL signal having a desired delay relative to the N+2 rising edge of the CLK signal. Thus, the SMD 300 generates the CLKDEL signal having a rising edge having a desired delay relative to the N rising edge of the CLK signal and in this way synchronizes the CLK and CLKDEL signals.

In the SMD 300, the generated CLKDEL signal has rising edges that are synchronized with every other rising edge of the CLK signal. For example, the initial rising edge of the CLKDEL signal occurs at the time T7 as just described, and the next rising edge occurs at a time T9 in synchronism with the N+4 rising edge of the CLK signal. Thus, in the embodiment of FIG. 3, the CLKDEL signal is only synchronized with alternate rising edges of the CLK signal. This is true because the up/down counter 316 begins operation in the down-count mode to time the delay DCD in response to the intervening rising edges of the CLK signal (actually in response to the CLKBUF signal generated in response to the intervening rising edges of the CLK signal). For example, in the example of FIG. 4 the N+1 rising edge of the CLK signal generates the CLUBUF signal at the time T4 that place the counter 316 in the down-count mode of operation. Since the counter 316 cannot be simultaneously operating in the up-count mode to time the delay UCD for the N+1 edge of the CLK signal, only alternate rising edges of CLK can be synchronized in the SMD 300. To generate a CLKDEL signal having rising edges synchronized to each rising edge of the CLK signal, another SMD 300 could simply be utilized, with the CLKDEL signals from each SMD then being applied through an OR gate (not shown) to clock the output buffer 312, as will be appreciated by those skilled in the art.

In the SMD 300, the single ring oscillator 302 is utilized to replace the large and relatively high-power forward and backward delay lines 108, 114 previously described with reference to the SMD 100 of FIG. 1. Moreover, the single ring oscillator 302 is utilized in generating both the coarse and fine delays of the CLKDEL signal. By utilizing the ring oscillator 302, a wide range of CLK signals may be synchronized, with a low or frequency CLK signals having correspondingly longer periods being accommodated merely by increasing the number of bits of the up/down coarse delay counter 316, as will be appreciated by those skilled in the art.

In addition, with the approach utilized by the SMD 300 in generating the CLKDEL signal, once the initial up-count delay UCD+UFD is determined, this delay may be mirrored or replayed in a variety of different ways, such as by another counter and ring oscillator circuit that is initialized with these values. Also, the value of the measured up-count delay UCD+UFD can be varied, such as dividing or multiplying the delay by an integer to thereby generate multiples or submultiples of the delay. In this way, the measured up-count delay UCD+UFD can be used, for example, to generate a clock signal having a frequency that is a multiple of the frequency of an applied clock signal.

Figure 7:
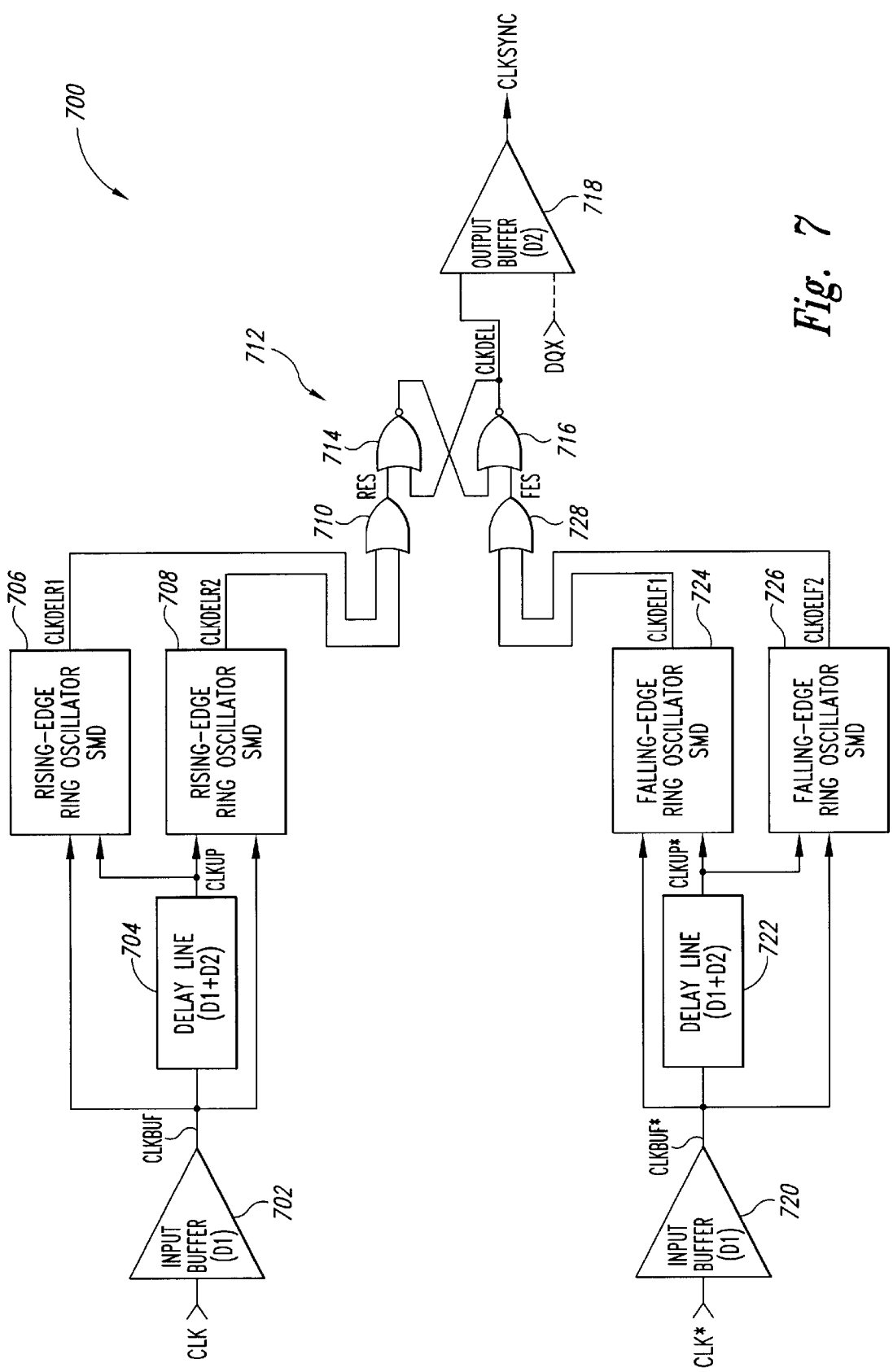
FIG. 7 is a functional block diagram illustrating a dual-edge SMD for generating a delayed clock signal having rising and falling edges synchronized with corresponding rising and falling edges of an applied clock signal according to another embodiment of the present invention.

Another situation where the use of separate counters and ring oscillators for measurement and replay is where the required model delay D1+D2 generated by the delay line 310 (FIG. 3) is longer than a single cycle of the applied clock signal. When the model delay D1+D2 is greater than a cycle of the applied clock signal, the measurement interval must be at least two clock cycles long to allow the up-count delay UCD+UFD to be properly measured. This is understood by referring to FIG. 4 and noting that if the model delay D1+D2 is greater than a cycle of the applied CLK signal, the rising edge of the CLKBUF signal at time T4, which is generated in response to the N+1 rising edge of the CLK signal at time T3, may not be used to terminate measurement of the up-count delay UCD+UFD since the model delay alone could extend beyond the time T4. In this situation, more SMDs 300 are needed to generate each edge of the applied CLK signal since each SMD requires longer to generate the respective delayed edge, and during this longer time additional edges of the applied CLK signal occur. This will be better understood with reference to FIG. 7 below which illustrates an SMD 700 including four SMDs that operate in the same way as the SMD 300 to generate all rising and falling edges of the applied CLK signal. If the model delay D1+D2 is greater than a cycle of the CLK signal but less than two cycles, the SMD 700 would require eight SMDs equivalent to the SMD 300, unless the measure and replay functions are separated and thereby performed by different counters and ring oscillators. If the measure and replay functions are separated, only one measure circuit and four replay circuits are required, even where the model delay D1+D2 is greater than a cycle of the applied CLK signal, as will be appreciated by those skilled in the art. FIG. 7 will be described in more detail below.

Figure 5:
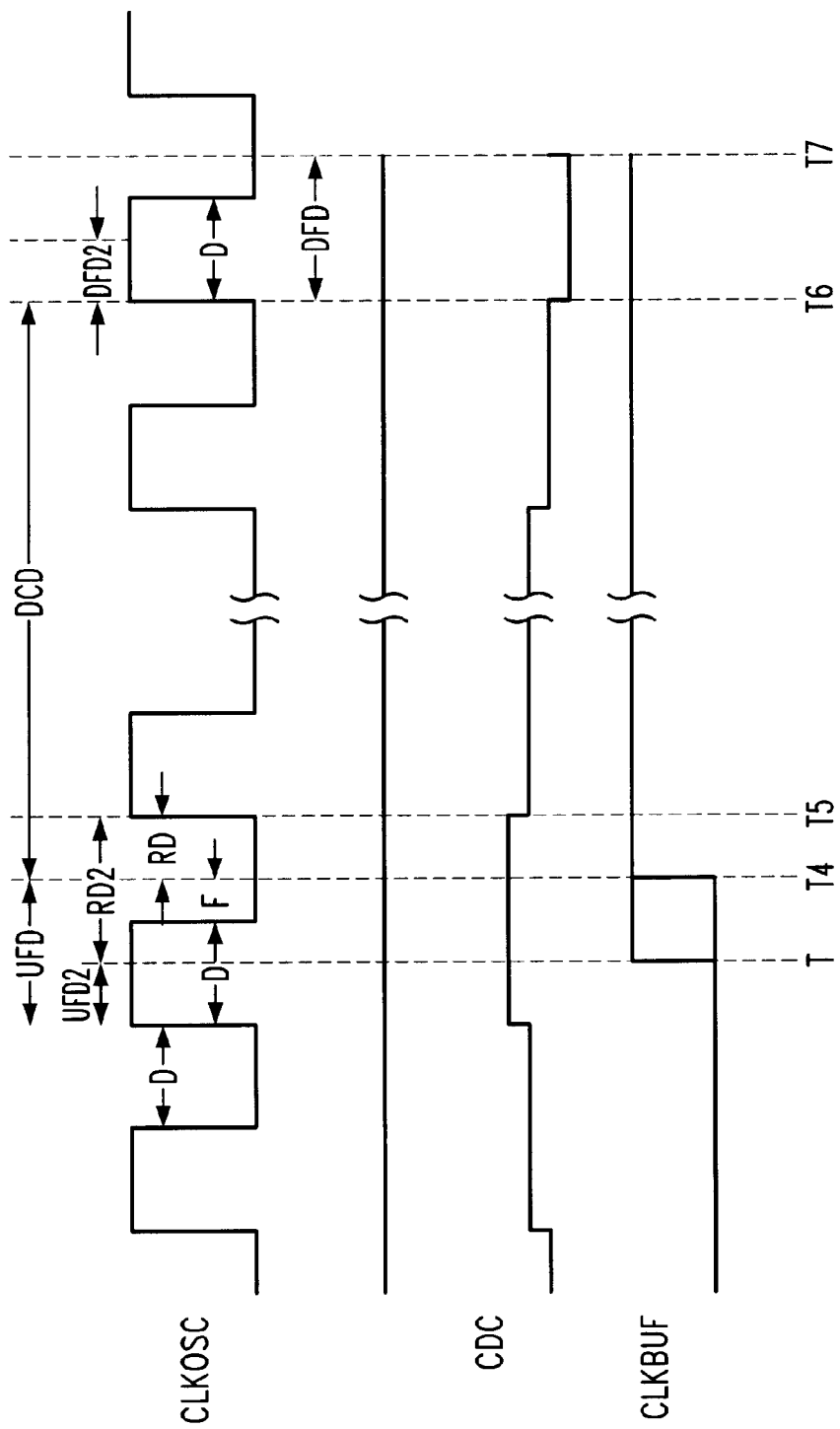
FIG. 5 is a signal timing diagram illustrating in more detail the operation of the SMD of FIG. 3 in generating the fine delay of the delayed clock signal.

The operation of the transform circuit 322 in selecting which FDC1–7 signal to activate will now be described in more detail with reference to FIG. 4 and a signal timing diagram of FIG. 5 that depicts several signals in the SMD 300 to illustrate the operation of the transform circuit 322 in more detail. In FIG. 5, the times T4–T7 correspond to the times with the same designations in FIG. 4. The transform circuit 322 selects the FDC1–7 signal to compensate for the additional delay that occurs between the time T4 and time T5 in FIG. 4, as will now be described in more detail. As illustrated in FIG. 5, when the rising edge of the CLKBUF signal occurs at the time T4 the corresponding up-count fine delay UFD is defined and the total delay UCD+UFD developed in the up-count mode is defined. The UFD delay corresponds to the location of the current edge of the CLKOSC signal in the ring oscillator 302 at the time T4. At the time T4, the up-count mode is terminated and the down-count mode of operation begins. Thus, the delay developed during the down-count mode includes a residual delay RD corresponding to the period between the times T4 and T5. Even though the counter 316 is not clocked until the time T5 to begin decrementing the CDC count in the down-count mode, this residual delay RD is part of the delay developed during the down-count mode. Accordingly, the down-count fine delay DFD corresponding to the period from time T6 to time T7, which is developed by the transform circuit 322, must account for the residual delay RD. Thus, the transform circuit 322 selects the FDC1–7 signal that makes the DFD delay equal to the UFD minus the RD delay (DFD=UFD−RD).

Table 1 below illustrates in table form the operation of the transform circuit 322 determining the location of the rising or falling edge of the clock signal propagating through the ring oscillator 302 and, from this determined location, selecting which tap signal T1–T7 that is to be output to activate the CLKDEL signal.

TABLE 1

Operation of Transform Fine Delay Transform Circuit 322
in Mapping Measure and Replay Functions of Ring Oscillator 302

| | During Measure | | During Replay | |
|---|---|---|---|---|
| RO Stored Stage (i.e., active FD1-7) | Stored State of T7 signal | Ending Coarse Down Count (CDC) | Ending State of T7 signal | Selected T1-T7 Signal from RO stage output as Fine Output Signal FEN |
| 1 | 0 | 0 | 0 | T1 |
| 2 | 0 | 0 | 0 | T3 |
| 3 | 0 | 0 | 0 | T5 |
| 4 | 0 | 0 | 0 | T7 |
| 5 | 0 | 0 | 1 | T2 |
| 6 | 0 | 0 | 1 | T4 |
| 7 | 0 | 0 | 1 | T6 |
| 1 | 1 | −1* | 0 | T1 |
| 2 | 1 | −1* | 0 | T3 |
| 3 | 1 | −1* | 0 | T5 |
| 4 | 1 | −1* | 0 | T7 |
| 5 | 1 | −1* | 1 | T2 |
| 6 | 1 | −1* | 1 | T4 |
| 7 | 1 | −1* | 1 | T6 |

*Count down past 0 to −1 (i.e. . . . 3,2,1,0,−1, . . .)

The columns of Table 1 will be referred to as columns 1–5 from left to right in the following discussion. Column 1 illustrates the location of the rising or falling edge of the clock signal propagating through the ring oscillator 302 in the form of the activated FD1–FD7 signal from the latch and compare circuit 320. When the latch and compare circuit 320 latches the states of the T1–T7 signals and activates one of the FD1–FD7 signals, the latched T7 signal will be either a binary "1" or "0" as indicated in the column 2 of Table 1. The columns 1 and 2 illustrate the final state of the various signals received by the transform circuit 322.

Columns 3 indicates the ending value of the down count CDC has when the CEN signal is activated, and as indicated by the "*" in rows 8–14 in Table 1 the CDC count goes past zero to −1 in some cases before the CEN signal is activated. Column 4 indicates the binary state of the T7 signal when the CDC count reaches the value designated in column 3, and column 5 indicates which T1–T7 signal is output as the CEN signal to thereby activate the CLKDEL signal. The transform circuit 322 activates the appropriate FDC1–FDC7 signal to output the desired T1–T7 signals, respectively. As the fifth row of Table 1 illustrates when the FD5 signal is activated and the latched T7 signal is a binary 0 at the end of the measurement interval, the transform circuit 322 thereafter outputs the T2 signal as the CEN signal during the replay interval when the CDC count equals 0. Thus, Table 1 illustrates the operation of the transform circuit 322 for all possible latched combinations of the T1–T7 signals at the end of the measure interval and the T1–T7 signal output as the CEN signal at the end of the corresponding replay interval, as will be understood by those skilled in the art.

Figure 6:
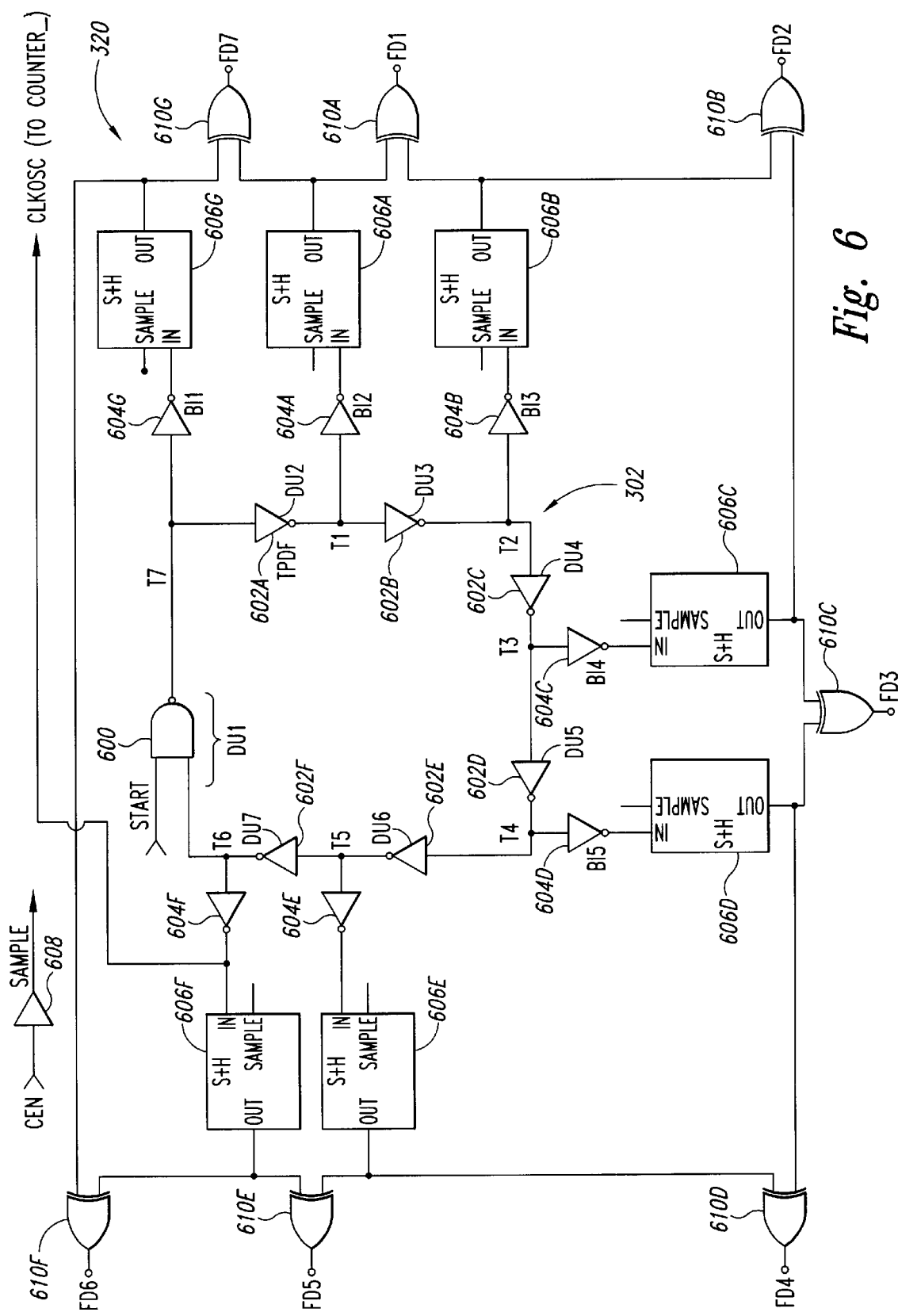
FIG. 6 is a functional block diagram and schematic illustrating one embodiment of a ring oscillator and a latch and compare circuit of FIG. 3.

FIG. 6 is a functional block diagram and schematic illustrating one embodiment of the ring oscillator 302 and the latch and compare circuit 320 of FIG. 3. The ring oscillator 302 includes a NAND gate 600 coupled in series with a plurality of series-connected inverters 602A-F, with the NAND gate and inverters 602–612 generating tap clock signals T1–T7, respectively. The NAND gate 600 corresponds to the inverter 314G in FIG. 3, and has a unit fine delay UFD that is matched to the unit fine delays of the inverters 602A-F, which correspond to the inverters 314A-F in FIG. 3. A second input of the NAND gate 600 receives a start signal START that goes low to cause the NAND gate 600 and inverters 602A-F to drive the T1–T7 signals to initial values, and thereafter goes high to enable the AND gate and thereby initiate operation of the ring oscillator 302.

The tap clock signals T1–T7 are applied through respective inverters 604A-G to a plurality of sample and hold circuits 606A-G. Each sample and hold circuit 606A-G latches the signal from the corresponding inverter 604A-G in response to a rising edged of a sample signal SAMPLE, and places the latched signal on an output. When the SAMPLE signal is low, each sample and hold circuit 606A-G drives the signal on its output low. The CEN signal is applied through a buffer 608 to generate the SAMPLE signal. A plurality of XOR gates 610A-G receive the outputs from pairs of sample and hold circuits 606A-G to thereby provide adjacent tap clock signals T1–T7 to each XOR gate. The XOR gates 610A-G generate the FD1–7 signals, respectively, in response to the outputs from the corresponding sample and hold circuits 606A-G. For example, the sample and hold circuits 606A and 606B latch the states of the tap clock signals T1 and T2, respectively, in response to a rising edge of the SAMPLE signal. The sample and hold circuits 606A, 606B apply the latched T1, T2 signals to the XOR gate 606A, which develops the FD1 signal having a value corresponding the XOR of the sampled T1 and T2 signals.

In operation, the START signal initially goes inactive low, causing the NAND gate 600 to drive the T7 signal high and the inverters 602A-F to drive the signals T1–T6 either high or low in response to the high T7 signal. At this point, the SAMPLE signal is low, causing each sample and hold circuit 606A-G to drive its output low which, in turn, causes the XOR gates 610A-G to drive the FD1–7 signals low. The START signal thereafter goes active high, causing the NAND gate 600 to drive the tap clock signal T7 low and starting an edge propagating through the inverters 604A-F and the NAND gate 600, as will be appreciated by those skilled in the art. When ever the CEN signal goes high, the buffer 608 drives the SAMPLE signal high, and the sample and hold circuits 606A-G latch the tap clock signals T1–T7 applied through the inverters 604A-G and apply these latched data clock signals to the XOR gates 610A-G. The XOR gates 610A-G thereafter generate the FD1–7 signals in response to the applied tap clock signals T1–T7. The XOR gate 610A-G that receives the pair of tap clock signals T1–T7 from the inverter 604A-G that was generating the current edge of the CLKOSC signal when the SAMPLE signal went high (i.e., both tap clock signals either high or low), drives the corresponding FD1–7 signal low.

FIG. 7 is a functional block diagram illustrating an SMD 700 that generates a synchronized clock signal CLKSYNC having rising and the falling edges that are synchronized with corresponding rising and falling edges of an applied clock signal CLK. The SMD 700 includes an input buffer 702 and a delay line 704 that develop a CLKBUF and a CLKUP signal, respectively, in response to an applied clock signal CLK in the same way as previously described for the corresponding components in the SMD 300 of FIG. 3. The CLKBUF and CLKUP signals are applied to first and second rising-edge ring oscillator SMD circuits 706, 708 that correspond to the components in the SMD 300 that receive the CLKBUF and CLKUP signals and generate the CLKDEL signal in response to these signals. The circuit 706 generates a rising-edge delayed clock signal CLKDELR1 having a desired delay relative to even alternate rising edges of the CLK signal, and the circuit 708 generates a rising-edge delayed clock signal CLKDELR2 having a desired delay relative to odd alternate rising edges of the CLK signal. An OR gate 710 receives the CLKDELR1–2 signals and generates a rising edge strobe RES in response to these signals. An RS flip-flop 712 formed by two cross-coupled NOR gates 714, 716 receive the RES signal on a set input and generates a CLKDEL signal having rising edges that have a predetermined delay relative to rising edges of the CLK signal. In response to the CLKDEL signal, an output buffer 718 generates the CLKSYNC signal having rising edges that are synchronized with rising edges of the CLK signal An input buffer 720 and a delay line 722 develop a CLKBUF* and a CLKUP* signal, respectively, in response to an applied complementary clock signal CLK* in the same way as previously described for the corresponding components in the SMD 300 of FIG. 3. The CLKBUF*, CLKUP* signals are applied to SMD circuits 724, 726 that correspond to the components in the SMD 300 that receive the CLKBUF and CLKUP signals and generate the CLKDEL signal in response to these signals. The circuit 724 generates a falling-edge delayed clock signal CLKDELF1 having a desired delay relative to even alternate falling edges of the CLK signal, and the circuit 726 generates a falling-edge delayed clock signal CLKDELF2 having a desired delay relative to odd alternate falling edges of the CLK signal. The OR gate 710 receives the CLKDELF1–2 signals and generates a falling edge strobe FES in response to these signals. The RS flip-flop 712 receives the FES signal on a reset input and generates the CLKDEL signal having falling edges that have a predetermined delay relative to falling edges of the CLK signal. The output buffer 718 generates the CLKSYNC signal having falling edges that are synchronized with falling edges of the CLK signal in response to the CLKDEL signal.

Figure 8:
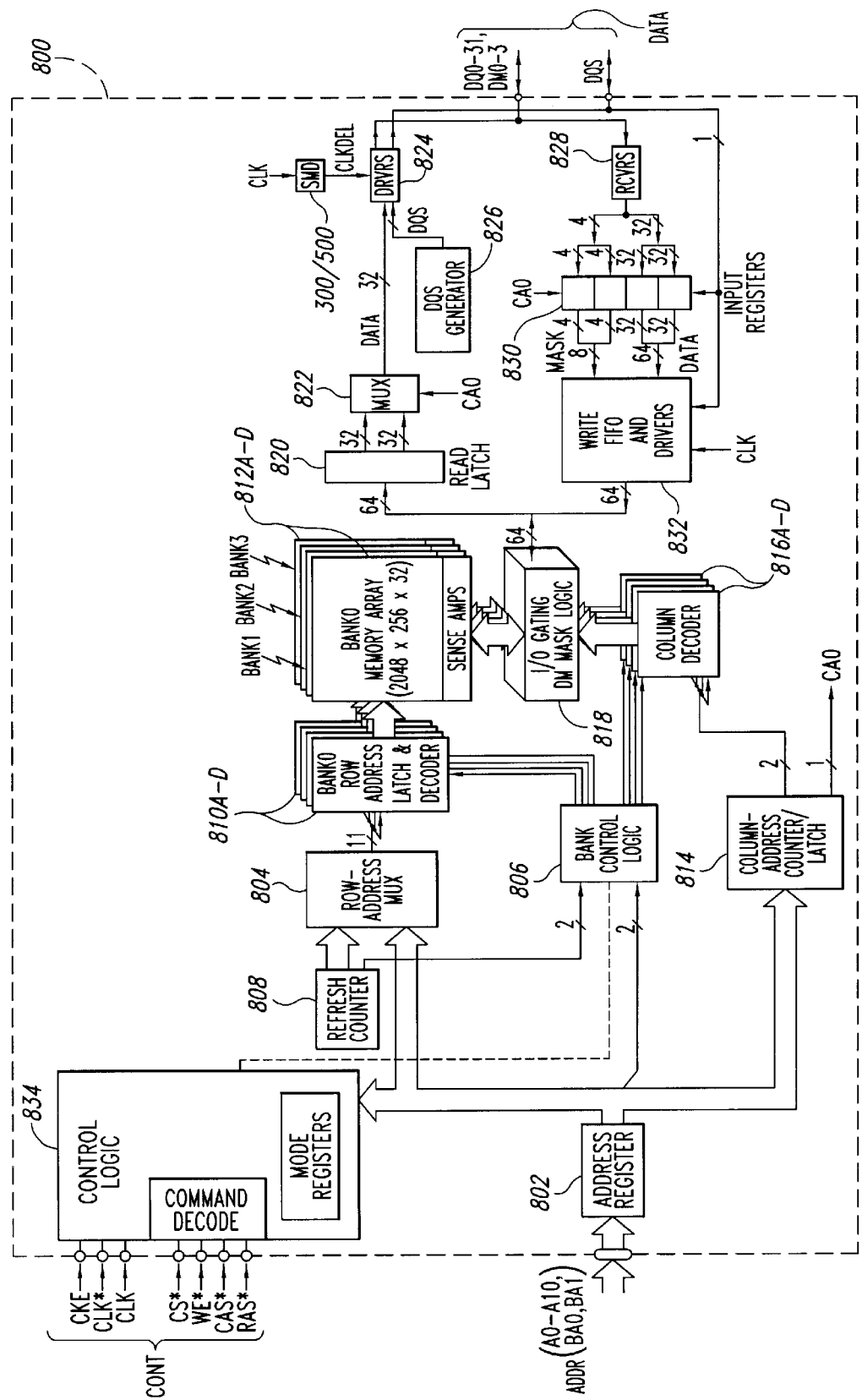
FIG. 8 is a functional block diagram of a synchronous memory device including the SMD of FIG. 3 and/or the SMD of FIG. 7.

FIG. 8 is a functional block diagram of a memory device 800 including the SMD 300 of FIG. 3 and/or the SMD 700 of FIG. 7. The memory device 800 in FIG. 8 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A-D. The bank control logic 806 activates the row address latch and decoder 810A-D corresponding to either the bank address received from the address register 802 or a refresh bank address from the refresh counter 808, and the activated row address latch and decoder latches and decodes the received row address. In response to the decoded row address, the activated row address latch and decoder 810A-D applies various signals to a corresponding memory bank 812A-D to thereby activate a row of memory cells corresponding to the decoded row address. Each memory bank 812A-D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A-D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A-D. The bank control logic 806 activates the column decoder 816A-D corresponding to the received bank address, and the activated column decoder decodes the applied column address. Depending on the operating mode of the memory device 800, the column address counter and latch 814 either directly applies the latched column address to the decoders 816A-D, or applies a sequence of column addresses to the decoders starting at the column address provided by the address register 802. In response to the column address from the counter and latch 814, the activated column decoder 816A-D applies decode and control signals to an I/O gating and data masking circuit 818 which, in turn, accesses memory cells corresponding to the decoded column address in the activated row of memory cells in the memory bank 812A-D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from the SMD 300/700. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the SMD is a delayed version of the CLK signal, and the SMD 300/700 adjusts the delay of the CLKDEL signal relative to the CLK signal to ensure that the DQS signal and the DQ words are placed on the DATA bus in synchronism with the CLK signal, as previously described with reference to FIGS. 3–6. The DATA bus also includes masking signals DM0-M, which will be described in more detail below with reference to data write operations.

During data write operations, an: external circuit such as a memory controller (not shown) applies N/2 bit data words DQ, the strobe signal DQS, and corresponding data masking signals DM0-X on the data bus DATA. A data receiver 828 receives each DQ word and the associated DM0-X signals, and applies these signals to input registers 830 that are clocked by the DQS signal. In response to a rising edge of the DQS signal, the input registers 830 latch a first N/2 bit DQ word and the associated DM0-X signals, and in response to a falling edge of the DQS signal the input registers latch the second N/2 bit DQ word and associated DM0-X signals. The input register 830 provides the two latched N/2 bit DQ words as an N-bit word to a write FIFO and driver 832, which clocks the applied DQ word and DM0-X signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A-D subject to the DM0-X signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 9:
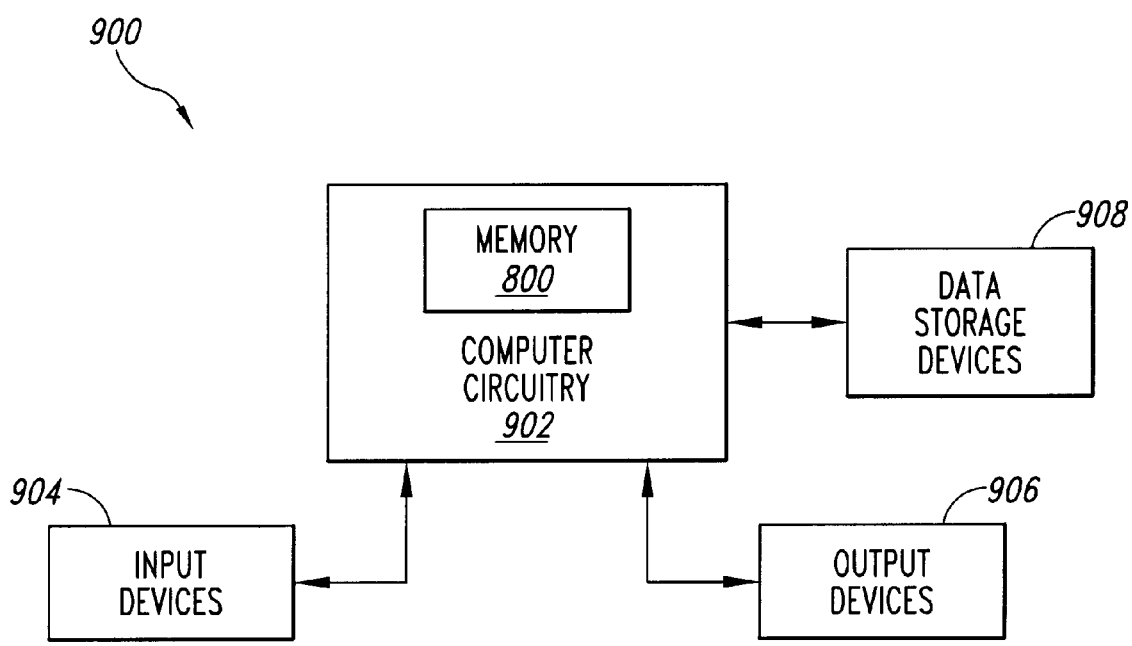
FIG. 9 is a functional block diagram of a computer system including the memory device of FIG. 8.

FIG. 9 is a block diagram of a computer system 900 including computer circuitry 902 that includes the memory device 800 of FIG. 8. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A synchronous mirror delay, comprising:

a ring oscillator operable to generate a plurality of tap clock signals with one tap clock signal being designated an oscillator clock signal, each tap clock signal having a respective delay relative to the oscillator clock signal;

a model delay line for receiving an input clock signal and operable to generate a model delayed clock signal in response to the input clock signal, the model delayed clock signal having a model delay relative to the input clock signal;

a coarse delay circuit for receiving the input clock signal and coupled to the ring oscillator and the model delay line, the coarse delay circuit operable to generate a coarse delay count responsive to the oscillator, input, and model delayed clock signals, and further operable to activate a coarse delay enable signal responsive to the delay count being equal to a reference count value;

a fine delay circuit coupled to the ring oscillator to receive the tap clock signals, coupled to the coarse delay circuit to receive the coarse delay enable signal, and for receiving the input clock signal, the fine delay circuit operable to latch the tap clock signals responsive to the input clock signal and to develop a fine delay from the latched tap clock signals, the fine delay circuit operable to activate a fine delay enable signal in response to the coarse delay enable signal, the fine delay enable signal having the fine delay relative to the coarse delay enable signal; and an output circuit coupled to the coarse and fine delay circuits, the output circuit generating a delayed clock signal responsive to the coarse and fine delay enable signals going active.

2. The synchronous mirror delay of claim 1 wherein the coarse delay count initially has the reference count value, and wherein the coarse delay circuit is operable during an up-count mode responsive to a transition of the model delayed clock signal to increment the coarse delay count responsive to the oscillator clock signal, and the coarse delay circuit operable during a down-count mode responsive to a transition of the input clock signal to decrement the coarse delay count responsive to the oscillator clock signal and to generate the coarse delay enable signal responsive to the coarse delay count being equal to the reference count value.

3. The synchronous mirror delay of claim 2 wherein the up-count mode is initiated responsive to a transition of the model delayed clock signal generated by the model delay line in response to an Nth transition of the input clock signal from a first logic level to a second logic level, and the down-count mode is initiated responsive to the N+1th transition of the input clock signal from the first to the second logic level.

4. The synchronous mirror delay of claim 1 wherein the fine delay circuit comprises:
   a multiplexer having a plurality of inputs coupled to the ring oscillator, each input receiving a respective tap clock signal, the multiplexer operable to provide a respective tap clock signal on an output responsive to a plurality of input selection signals, with the tap clock signal on the output corresponding to the fine delay enable signal;
   a latch and compare circuit coupled to the ring oscillator, the latch and compare circuit operable to latch the tap clock signals responsive to the input clock signal and to generate a plurality of fine delay signals responsive to the latched tap clock signals; and
   a fine delay transform circuit coupled to receive the coarse delay enable signal and coupled to the latch and compare circuit and the multiplexer, the fine delay transform circuit operable in response to the fine delay signals to select a respective input selection signal and to activate the selected input selection signal responsive to the coarse delay enable signal going active.

5. The synchronous mirror delay of claim 4 wherein the multiplexer comprises a plurality of transmission gates.

6. The synchronous mirror delay of claim 4 wherein the ring oscillator includes N delay stages that generate tap clock signals T1–TN, respectively, and the latch and compare circuit latches tap clock signals T1–TN from the ring oscillator and performs an XOR operation on each pair of latched tap clock signals T1–T2, T2–T3, and so on through TN-1-TN, and also performs an XOR operation on the pair T1 and TN, with each XOR operation generating a corresponding fine delay signal.

7. The synchronous mirror delay of claim 6 wherein the fine delay transform circuit operates in a first mode responsive to a selected one of the tap clock signals T1–TN having a first logic state.

8. The synchronous mirror delay of claim 7 wherein the fine delay transform circuit operates in a second mode responsive to a selected one of the tap clock signals T1–TN having a second logic state.

9. The synchronous mirror delay of claim 1 wherein the output circuit comprises an AND gate.

10. The synchronous mirror delay of claim 1 wherein the coarse delay circuit comprises:
    an up/down counter coupled to receive the input clock signal and the model delayed clock signal, and coupled to the ring oscillator to receive the oscillator clock signal, the up/down counter operable responsive to a transition of the model delayed clock signal to increment the coarse delay count from the reference count value responsive to the oscillator clock signal, and operable responsive to a transition of the input clock signal to decrement the coarse delay count responsive to the oscillator clock signal; and
    a comparator coupled to the up/down counter, the comparator activating the coarse delay enable signal responsive to the coarse delay count being equal to the reference count value.

11. A synchronous mirror delay, comprising:
    an input buffer adapted to receive an input clock signal and operable to generate a buffered clock signal in response to the input clock signal;
    a ring oscillator operable to generate a plurality of tap clock signals with one tap clock signal being designated an oscillator clock signal, each tap clock signal having a respective delay relative to the oscillator clock signal;
    a model delay line coupled to the input buffer to receive the buffered clock signal and operable to generate a model delayed clock signal in response to the buffered clock signal, the model delayed clock signal having a model delay relative to the buffered clock signal;
    a coarse delay circuit coupled to the input buffer, ring oscillator, and the model delay line, the coarse delay circuit operable to generate a coarse delay count responsive to the oscillator, buffered, and model delayed clock signals, and further operable to activate a coarse delay enable signal responsive to the delay count being equal to a reference count value;
    a fine delay circuit coupled to the ring oscillator to receive the tap clock signals, coupled to the coarse delay circuit to receive the coarse delay enable signal, and coupled to the input buffer to receive the buffered clock signal, the fine delay circuit operable to latch the tap clock signals responsive to the buffered clock signal and to develop a fine delay from the latched tap clock signals, the fine delay circuit operable to activate a fine delay enable signal in response to the coarse delay enable signal, the fine delay enable signal having the fine delay relative to the coarse delay enable signal;
    a delayed signal generation circuit coupled to the coarse and fine delay circuits and operable to generate a delayed clock signal responsive to the coarse and fine delay enable signals going active; and
    an output buffer coupled to the delayed signal generation circuit and operable to generate a synchronized clock signal responsive to the delayed clock signal, the synchronized clock signal having edges that are synchronized with edges of the input clock signal.

12. The synchronous mirror delay of claim 11 wherein the coarse delay count initially has the reference count value, and wherein the coarse delay circuit is operable during an up-count mode responsive to a transition of the model delayed clock signal to increment the coarse delay count responsive to the oscillator clock signal, and the coarse delay circuit operable during a down-count mode responsive to a transition of the buffered clock signal to decrement the coarse delay count responsive to the oscillator clock signal and to generate the coarse delay enable signal responsive to the coarse delay count being equal to the reference count value.

13. The synchronous mirror delay of claim 12 wherein the up-count mode is initiated responsive to a transition of the model delayed clock signal generated by the model delay line in response to an Nth transition of the buffered clock signal from a first logic level to a second logic level, and the down-count mode is initiated responsive to the N+1th transition of the buffered clock signal from the first to the second logic level.

14. The synchronous mirror delay of claim 11 wherein the fine delay circuit comprises:
    a multiplexer having a plurality of inputs coupled to the ring oscillator, each input receiving a respective tap clock signal, the multiplexer operable to provide a respective tap clock signal on an output responsive to a plurality of input selection signals, with the tap clock signal on the output corresponding to the fine delay enable signal;

a latch and compare circuit coupled to the ring oscillator, the latch and compare circuit operable to latch the tap clock signals responsive to the buffered clock signal and to generate a plurality of fine delay signals responsive to the latched tap clock signals; and a fine delay transform circuit coupled to receive the coarse delay enable signal and coupled to the latch and compare circuit and the multiplexer, the fine delay transform circuit operable in response to the fine delay signals to select a respective input selection signal and to activate the selected input selection signal responsive to the coarse delay enable signal going active.

15. The synchronous mirror delay of claim 14 wherein the multiplexer comprises a plurality of transmission gates.

16. The synchronous mirror delay of claim 14 wherein the ring oscillator includes N delay stages that generate tap clock signals T1–TN, respectively, and the latch and compare circuit latches tap clock signals T1–TN from the ring oscillator and performs an XOR operation on each pair of latched tap clock signals T1-T2, T2-T3, and so on through TN-1-TN, and also performs an XOR operation on the pair T1 and TN, with each XOR operation generating a corresponding fine delay signal.

17. The synchronous mirror delay of claim 16 wherein the fine delay transform circuit operates in a first mode responsive to a selected one of the tap clock signals T1–TN having a first logic state.

18. The synchronous mirror delay of claim 17 wherein the fine delay transform circuit operates in a second mode responsive to a selected one of the tap clock signals T1–TN having a second logic state.

19. The synchronous mirror delay of claim 11 wherein the input buffer introduces a delay D1 to the buffered clock signal relative to the input clock signal and the output buffer introduces a delay D2 to the synchronized clock signal relative to the delayed clock signal, and the model delay as first and second components that model the delays D1 and D2.

20. The synchronous mirror delay of claim 11 wherein the coarse delay circuit comprises:

an up/down counter coupled to receive the buffered clock signal and the model delayed clock signal, and coupled to the ring oscillator to receive the oscillator clock signal, the up/down counter operable responsive to a transition of the model delayed clock signal to increment the coarse delay count from the reference count value responsive to the oscillator clock signal, and operable responsive to a transition of the buffered clock signal to decrement the coarse delay count responsive to the oscillator clock signal; and a comparator coupled to the up/down counter, the comparator activating the coarse delay enable signal responsive to the coarse delay count being equal to the reference count value.

21. A synchronous mirror delay, comprising:

a first input buffer adapted to receive an input clock signal and operable to generate a buffered clock signal in response to the input clock signal;

a first ring oscillator operable to generate a plurality of tap clock signals with one tap clock signal being designated an oscillator clock signal, each tap clock signal having a respective delay relative to the oscillator clock signal;

a first model delay line coupled to the first input buffer to receive the buffered clock signal and operable to generate a model delayed clock signal in response to the buffered clock signal, the model delayed clock signal having a model delay relative to the buffered clock signal;

a first rising-edge synchronous mirror delay circuit coupled to the first ring oscillator and operable to generate a delayed clock signal have course and fine delays developed from the tap clock signals, the coarse and fine delays defining a delay of the delayed clock signal relative to even rising edges of the input clock signal;

a second rising-edge synchronous mirror delay circuit coupled to the first ring oscillator and operable to generate a delayed clock signal have course and fine delays developed from the tap clock signals, the coarse and fine delays defining a delay of the delayed clock signal relative to odd rising edges of the input clock signal;

a second input buffer adapted to receive an input clock signal and operable to generate a buffered clock signal in response to the input clock signal;

a second ring oscillator operable to generate a plurality of tap clock signals with one tap clock signal being designated an oscillator clock signal, each tap clock signal having a respective delay relative to the oscillator clock signal;

a model delay line coupled to the second input buffer to receive the buffered clock signal and operable to generate a model delayed clock signal in response to the buffered clock signal, the model delayed clock signal having a model delay relative to the buffered clock signal;

a first falling-edge synchronous mirror delay circuit coupled to the second ring oscillator and operable to generate a delayed clock signal have course and fine delays developed from the tap clock signals, the coarse and fine delays defining a delay of the delayed clock signal relative to even falling edges of the input clock signal;

a second falling-edge synchronous mirror delay circuit coupled to the second ring oscillator and operable to generate a delayed clock signal have course and fine delays developed from the tap clock signals, the coarse and fine delays defining a delay of the delayed clock signal relative to odd falling edges of the input clock signal; and an output circuit coupled to the first and second rising- and falling-edge synchronous mirror delay circuits, and operable to develop a synchronized clock signal responsive to the delayed clock signals from the mirror delay circuits, the synchronized clock signal being synchronized with the input clock signal.

22. The synchronous mirror delay of claim 21 wherein each of the synchronous mirror delay circuits includes a fine delay circuit, comprising:

a multiplexer having a plurality of inputs coupled to a respective ring oscillator, each input receiving a respective tap clock signal, the multiplexer operable to provide a respective tap clock signal on an output responsive to a plurality of input selection signals, with the tap clock signal on the output corresponding to the fine delay enable signal;

a latch and compare circuit coupled to the respective ring oscillator, the latch and compare circuit operable to latch the tap clock signals responsive to the input clock signal and to generate a plurality of fine delay signals responsive to the latched tap clock signals; and a fine delay transform circuit coupled to receive the coarse delay enable signal and coupled to the latch and compare circuit and the multiplexer, the fine delay transform circuit operable in response to the fine delay signals to select a respective input selection signal and to activate the selected input selection signal responsive to the coarse delay enable signal going active.

23. The synchronous mirror delay of claim 22 wherein the multiplexer comprises a plurality of transmission gates.

24. The synchronous mirror delay of claim 21 wherein each ring oscillator includes N delay stages that generate tap clock signals T1–TN, respectively, and the latch and compare circuit latches tap clock signals T1–TN from the ring oscillator and performs an XOR operation on each pair of latched tap clock signals T1-T2, T2-T3, and so on through TN-1-TN, and also performs an XOR operation on the pair T1 and TN, with each XOR operation generating a corresponding fine delay signal.

25. The synchronous mirror delay of claim 21 wherein the output circuit comprises a first OR gate coupled to receive the delayed clock signals from the first and second rising-edge synchronous mirror delay circuits, a second OR gate coupled to receive the delayed clock signals from the first and second falling-edge synchronous mirror delay circuits, an RS flip-flop coupled to the first and second OR gates to receive set and reset inputs and operable to develop an output delayed clock signal, responsive to the reset and set inputs, and an output buffer coupled to the RS flip-flop and operable to generate the synchronized clock signal responsive to the output delayed clock signal.

26. The synchronous mirror delay of claim 21 wherein each synchronous mirror delay circuit includes a coarse delay circuit, comprising:

an up/down counter coupled to receive the input clock signal and the model delayed clock signal, and coupled to the ring oscillator to receive the oscillator clock signal, the up/down counter operable responsive to a transition of the model delayed clock signal to increment the coarse delay count from the reference count value responsive to the oscillator clock signal, and operable responsive to a transition of the input clock signal to decrement the coarse delay count responsive to the oscillator clock signal; and a comparator coupled to the up/down counter, the comparator activating the coarse delay enable signal responsive to the coarse delay count being equal to the reference count value.

27. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a synchronous mirror delay coupled to at least the control circuit and adapted to receive an input clock signal, the synchronous mirror delay operable to generate a delayed clock signal and the control circuit generating control signals in response to the delayed clock signal, the synchronous mirror delay comprising, a ring oscillator operable to generate a plurality of tap clock signals with one tap clock signal being designated an oscillator clock signal, each tap clock signal having a respective delay relative to the oscillator clock signal;

a model delay line for receiving an input clock signal and operable to generate a model delayed clock signal in response to the input clock signal, the model delayed clock signal having a model delay relative to the input clock signal;

a coarse delay circuit for receiving the input clock signal and coupled to the ring oscillator and the model delay line, the coarse delay circuit operable to generate a coarse delay count responsive to the oscillator, input, and model delayed clock signals, and further operable to activate a coarse delay enable signal responsive to the delay count being equal to a reference count value;

a fine delay circuit coupled to the ring oscillator to receive the tap clock signals, coupled to the coarse delay circuit to receive the coarse delay enable signal, and for receiving the input clock signal, the fine delay circuit operable to latch the tap clock signals responsive to the input clock signal and to develop a fine delay from the latched tap clock signals, the fine delay circuit operable to activate a fine delay enable signal in response to the coarse delay enable signal, the fine delay enable signal having the fine delay relative to the coarse delay enable signal; and an output circuit coupled to the coarse and fine delay circuits, the output circuit generating a delayed clock signal responsive to the coarse and fine delay enable signals going active.

28. The memory device of claim 27 wherein the memory device comprises a DDR SDRAM and the synchronous mirror delay receives complementary input clock signals and generates the delayed clock signal that is synchronized to the rising and falling edges of the clock signals, the delayed clock signal being applied to clock an output driver coupled to the data bus.

29. A computer system, comprising:
a data input device;
a data output device;
a processor coupled to the data input and output devices; and
a memory device coupled to the processor, comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; and
a synchronous mirror delay coupled to at least the control circuit and adapted to receive an input clock signal, the synchronous mirror delay operable to generate a delayed clock signal and the control circuit generating control signals in response to the delayed clock signal, the synchronous mirror delay comprising, a ring oscillator operable to generate a plurality of tap clock signals with one tap clock signal being designated an oscillator clock signal, each tap clock signal having a respective delay relative to the oscillator clock signal;

a model delay line for receiving an input clock signal and operable to generate a model delayed clock signal in response to the input clock signal, the model delayed clock signal having a model delay relative to the input clock signal;

a coarse delay circuit for receiving the input clock signal and coupled to the ring oscillator and the model delay line, the coarse delay circuit operable to generate a coarse delay count responsive to the oscillator, input, and model delayed clock signals, and further operable to activate a coarse delay enable signal responsive to the delay count being equal to a reference count value;

a fine delay circuit coupled to the ring oscillator to receive the tap clock signals, coupled to the coarse delay circuit to receive the coarse delay enable signal, and adapted to receive the input clock signal, the fine delay circuit operable to latch the tap clock signals responsive to the input clock signal and to develop a fine delay from the latched tap clock signals, the fine delay circuit operable to activate a fine delay enable signal in response to the coarse delay enable signal, the fine delay enable signal having the fine delay relative to the coarse delay enable signal; and an output circuit coupled to the coarse and fine delay circuits, the output circuit generating a delayed clock signal responsive to the coarse and fine delay enable signals going active.

30. The computer system of claim 29 wherein the memory device comprises a DDR SDRAM and the synchronous mirror delay receives complementary input clock signals and generates the delayed clock signal that is synchronized to the rising and falling edges of the clock signals, the delayed clock signal being applied to clock an output driver coupled to the data bus.

31. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

generating a model delayed clock signal in response to the applied clock signal, the model delayed clock signal having a model delay relative to the applied clock signal;

initiating a time-to-digital count coarse delay interval in response to a transition of the model delayed clock signal generated in response to an Nth transition of the applied clock signal;

incrementing a coarse delay count responsive to the reference oscillator clock signal during the first coarse delay interval;

terminating the first coarse delay interval responsive to an N+1th transition of the applied clock signal;

storing the states of the oscillator clock signals when the first coarse delay interval is terminated;

initiating a digital-to-time coarse delay interval in response to the applied clock signal;

decrementing the coarse delay count responsive to the reference oscillator clock signal during the digital-to-time coarse delay interval;

calculating a digital-to-time fine delay from the stored states of the oscillator clock signals; and generating the delayed clock signal having the delay relative to the applied clock signal that is determined by the coarse delay count being equal to a reference value plus the calculated digital-to-fine delay.

32. The method of claim 31 wherein calculating a digital-to-time fine delay from the stored states of the oscillator clock signals comprises calculating the fine delay in a according to a first methodology responsive to a selected one of the tap clock signals T1–TN having a first logic state.

33. The method of claim 32 wherein calculating a digital-to-time fine delay from the stored states of the oscillator clock signals comprises calculating the fine delay according to a second methodology responsive to a selected one of the tap clock signals T1–TN having a second logic state.

34. The method of claim 31 wherein storing the states of the oscillator clock signals when the first coarse delay interval is terminated comprises storing the instantaneous states of the clock signals, and thereafter performing an XOR operation on adjacent pairs of clock signals to generate a plurality of fine delay control signals, with the fine delay control signal having a false value indicating the location of the reference oscillator clock signal edge at the point in time when the first coarse delay interval is terminated.

35. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

timing a coarse delay time in response to transitions of the reference oscillator clock signal;

storing the states of the oscillator clock signals at a first time; timing a digital-to-time coarse delay time in response to transitions of the reference oscillator clock signal after the first time;

calculating a fine delay time from the states of the oscillator clock signals at the first time; and generating the delayed clock signal having a delay relative to the applied clock signal that is given by the sum of the coarse delay time plus the replayed coarse delay time plus the fine delay time.

36. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

timing a coarse delay time in response to transitions of the reference oscillator clock signal;

storing the instantaneous states of the oscillator clock signals, and thereafter performing an XOR operation on adjacent pairs of clock signals to generate a plurality of fine delay control signals, with the fine delay control signal having a false value indicating the location of the reference oscillator clock signal edge at a first time;

replaying the coarse delay time;

calculating a fine delay time from the instantaneous states of the oscillator clock signals; and generating the delayed clock signal having a delay relative to the applied clock signal that is given by the sum of the coarse delay time plus the replayed coarse delay time plus the fine delay time.

37. A method for generating a delayed clock signal having a delay relative to an applied clock signal, the method comprising:

generating a plurality of oscillator clock signals, each oscillator clock signal having a frequency that is greater than the applied clock signal, with one oscillator clock signal being designated a reference oscillator clock signal and each oscillator clock signal having a delay relative to the reference oscillator clock signal;

timing a coarse delay time in response to transitions of the reference oscillator clock signal;

storing the states of the oscillator clock signals at a first time;

replaying the coarse delay time;

calculating a fine delay time from the states of the oscillator clock signals at the first time; and generating the delayed clock signal having a delay relative to the applied clock signal that is given by the sum of the coarse delay time plus the replayed coarse delay time plus the fine delay time, wherein a first circuit generates the plurality of oscillator clocks signals, times the coarse delay time, and calculates the fine delay time, and wherein a second circuit replays the coarse delay time and generates the delayed clock signal.

38. The method of claim 37 wherein the first and second circuits are different circuits.

39. A digital measuring system comprising:

a ring oscillator with a start function, operable to generate a plurality of tap clock signals with one tap clock signal being designated an oscillator clock signal, each tap clock signal having a respective delay relative to the oscillator clock signal;

a coarse delay measuring circuit for receiving the ring oscillator start signal and a measure signal, and coupled to the ring oscillator clock signal, operable to generate a cycle count of the oscillator clock signal between the start signal and the measure signal and thereby to develop a coarse digital delay measurement result;

a fine delay measuring circuit coupled to the ring oscillator to receive the tap clock signals and for receiving the measure signal operable to latch the tap clock signals responsive to the measure signal and thereby to develop a fine digital delay measurement result.

40. A digital replay system comprising:

a ring oscillator with a start function, operable to generate a plurality of tap clock signals with one tap clock signal being designated an oscillator clock signal, each tap clock signal having a respective delay relative to the oscillator clock signal;

a coarse delay replay circuit for receiving and storing coarse digital delay measurement data from the digital delay measuring system and the ring oscillator start signal, and coupled to the ring oscillator clock signal, operable to generate a cycle count based on the oscillator clock signal and to generate a coarse delay replay signal when the cycle count equals the stored digital delay measurement data;

a fine delay replay circuit to receive the fine digital delay measurement data and the coarse delay replay signal, and coupled to the ring oscillator to receive the tap clock signals, and for developing a fine delay replay signal at the first digitally selected tap clock edge after the activation of the coarse delay replay signal.

* * * * *

UNITED STATES PATENT AND TRADEMARK OFFICE
CERTIFICATE OF CORRECTION

PATENT NO. : 6,727,740 B2
DATED : April 27, 2004
INVENTOR(S) : Howard C. Kirsch

It is certified that error appears in the above-identified patent and that said Letters Patent is hereby corrected as shown below:

Title page,
Item [56], References Cited, OTHER PUBLICATIONS, "Jang" reference, reads "Jang, Seong-Jin et al. A Compact Ring Delay Line for High Speed Synchronous DRAM, IEEE Symposium on VLSI Circuits Digest of Technical Papers, 1998, pp. 60-61." should read -- Jang, Seong-Jin et al., "A Compact Ring Delay Line for High Speed Synchronous DRAM," IEEE Symposium on VLSI Circuits Digest of Technical Papers, 1998, pp. 60-61. --
"Takai" reference "Takai, Yasuhiro et al., A 250 Mb/s/pin 1Gb Double Data Rate SDRAM with a Bi-Directional Delay and an Inter-Bank Shared Redundancy Scheme, 1999." should read -- Takai, Yasuhiro et al., "A 250 Mb/s/pin 1 Gb Double Data Rate SDRAM with a Bi-Directional Delay and an Inter-Bank Share Redundancy Scheme," 1999. --
"Jang" reference "Jang, Seong-Jin et al. A Compact Ring Delay Line for High Speed Synchronous DRAM, IEEE Symposium on VLSI Circuits Digest of Technical Papers, 1998, pp. 60-61." should read -- Jang, Seong-Jin et al., "A Compact Ring delay Line for High Speed Synchronous DRAM," IEEE Symposium on VLSI Circuits Digest of Technical Papers, 1998, pp. 60-61. --

Column 1,
Line 17, reads "relative the rising" should read -- relative to the rising --
Line 53, read "and in modem syn-" should read -- and in modern syn- --

Column 4,
Line 7, reads "line. 114 and an output" should read -- line 114 and an output --
Line 38, reads "stages 11A-N," should read -- stages 110A-N,- --

Column 6,
Line 28, "response to rising edge" should read -- response to the rising edge --

Column 8,
Line 26, reads "of latch and compare" should read -- of the latch and compare --
Line 58, reads "at the time t4," should read -- at the time T4, --

Column 9,
Line 32, reads "that place the" should read -- that places the --
Line 51, reads "with a low or frequency CLK signals" should read -- with lower frequency CLK signals --

UNITED STATES PATENT AND TRADEMARK OFFICE
CERTIFICATE OF CORRECTION

PATENT NO. : 6,727,740 B2
DATED : April 27, 2004
INVENTOR(S) : Howard C. Kirsch

It is certified that error appears in the above-identified patent and that said Letters Patent is hereby corrected as shown below:

Column 11,
Line 40, reads "ending value of the down" should read -- ending value the down --

Column 12,
Line 12, reads "rising edged" should read -- rising edge --
Line 28, reads "corresponding the XOR" should read -- corresponding to the XOR --
Line 41, reads "When ever the CEN" should read -- Whenever the CEN --
Line 55, reads "having rising and the falling edges" should read -- having rising and falling edges --

Column 13,
Line 8, reads "receive the RES signal" should read -- receives the RES signal --

Column 14,
Line 49, reads "received N/2 bits words" should read -- received N/2 bit words --
Line 66, reads "an: external circuit" should read -- an external circuit --

Column 16,
Line 5, reads "such as output" should read -- such output --
Line 11, reads "compact disk read-only (CD-ROMs)" should read -- compact disk read-only memories (CD-ROMs) --

Column 20,
Lines 9 and 38, reads "have course and fine" -- having coarse and fine --

Column 21,
Line 30, reads "clock signal,responsive" should read -- clock signal responsive.

Column 24,
Line 5, reads "fine delay in a" should read -- fine delay --
Lines 34, reads "storing the states of the oscillator clock signals at a first time; timing a digital-to-time" should read -- storing the states of the oscillator clock signals at a first time; timing a digital-to-time --

UNITED STATES PATENT AND TRADEMARK OFFICE
CERTIFICATE OF CORRECTION

PATENT NO. : 6,727,740 B2
DATED : April 27, 2004
INVENTOR(S) : Howard C. Kirsch

It is certified that error appears in the above-identified patent and that said Letters Patent is hereby corrected as shown below:

Column 25,
Line 22, reads "oscillator clocks signals" should read -- oscillator clock signals --

Signed and Sealed this

Eighth Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,727,740 B2
DATED : April 27, 2004
INVENTOR(S) : Howard C. Kirsch

It is certified that error appears in the above-identified patent and that said Letters Patent is hereby corrected as shown below:

Title page,
Item [56], References Cited, OTHER PUBLICATIONS, "Jang" reference, reads "Jang, Seong-Jin et al. A Compact Ring Delay Line for High Speed Synchronous DRAM, IEEE Symposium on VLSI Circuits Digest of Technical Papers, 1998, pp. 60-61." should read -- Jang, Seong-Jin et al., "A Compact Ring Delay Line for High Speed Synchronous DRAM," IEEE Symposium on VLSI Circuits Digest of Technical Papers, 1998, pp. 60-61. --.
"Takai" reference "Takai, Yasuhiro et al., A 250 Mb/s/pin 1Gb Double Data Rate SDRAM with a Bi-Directional Delay and an Inter-Bank Shared Redundancy Scheme, 1999." should read -- Takai, Yasuhiro et al., "A 250 Mb/s/pin 1 Gb Double Data Rate SDRAM with a Bi-Directional Delay and an Inter-Bank Share Redundancy Scheme," 1999. --.
"Jang" reference "Jang, Seong-Jin et al. A Compact Ring Delay Line for High Speed Synchronous DRAM, IEEE Symposium on VLSI Circuits Digest of Technical Papers, 1998, pp. 60-61." should read -- Jang, Seong-Jin et al., "A Compact Ring delay Line for High Speed Synchronous DRAM," IEEE Symposium on VLSI Circuits Digest of Technical Papers, 1998, pp. 60-61. --.

Column 1,
Line 17, reads "relative the rising" should read -- relative to the rising --.
Line 53, read "and in modem syn-" should read -- and in modern syn- --.

Column 4,
Line 7, reads "line. 114 and an output" should read -- line 114 and an output --.
Line 38, reads "stages 11A-N," should read -- stages 110A-N,- --.

Column 6,
Line 28, "response to rising edge" should read -- response to the rising edge --.

Column 8,
Line 26, reads "of latch and compare" should read -- of the latch and compare --.
Line 58, reads "at the time t4," should read -- at the time T4, --.

Column 9,
Line 32, reads "that place the" should read -- that places the --.
Line 51, reads "with a low or frequency CLK signals" should read -- with lower frequency CLK signals --.

UNITED STATES PATENT AND TRADEMARK OFFICE
CERTIFICATE OF CORRECTION

PATENT NO.     : 6,727,740 B2
DATED          : April 27, 2004
INVENTOR(S)    : Howard C. Kirsch It is certified that error appears in the above-identified patent and that said Letters Patent is hereby corrected as shown below:

Column 11,
Line 40, reads "ending value of the down" should read -- ending value the down --

Column 12,
Line 12, reads "rising edged" should read -- rising edge --.
Line 28, reads "corresponding the XOR" should read -- corresponding to the XOR --.
Line 41, reads "When ever the CEN" should read -- Whenever the CEN --.
Line 55, reads "having rising and the falling edges" should read -- having rising and falling edges --.

Column 13,
Line 8, reads "receive the RES signal" should read -- receives the RES signal --.

Column 14,
Line 49, reads "received N/2 bits words" should read -- received N/2 bit words --.
Line 66, reads "an: external circuit" should read -- an external circuit --.

Column 16,
Line 5, reads "such as output" should read -- such output --.
Line 11, reads "compact disk read-only (CD-ROMs)" should read -- compact disk read-only memories (CD-ROMs) --.

Column 20,
Lines 9, 38 and 45, reads "have course and fine" should read -- having coarse and fine --.

Column 21,
Line 30, reads "clock signal,responsive" should read -- clock signal responsive --.

Column 24,
Line 5, reads "fine delay in a" should read -- fine delay --.
Lines 34, reads "storing the states of the oscillator clock signals at a first time; timing a digital-to-time" should read -- storing the states of the oscillator clock signals at a first time; timing a digital-to-time --.

UNITED STATES PATENT AND TRADEMARK OFFICE
CERTIFICATE OF CORRECTION

PATENT NO.    : 6,727,740 B2
DATED         : April 27, 2004
INVENTOR(S)   : Howard C. Kirsch It is certified that error appears in the above-identified patent and that said Letters Patent is hereby corrected as shown below:

<u>Column 25,</u>
Line 22, reads "oscillator clocks signals" should read -- oscillator clock signals --.

This certificate supersedes Certificate of Correction issued March 8, 2005.

Signed and Sealed this

Eleventh Day of October, 2005

JON W. DUDAS
*Director of the United States Patent and Trademark Office*